US006970228B1

(12) United States Patent
Aoki et al.

(10) Patent No.: US 6,970,228 B1
(45) Date of Patent: Nov. 29, 2005

(54) EXPOSURE METHOD AND SYSTEM

(75) Inventors: Takashi Aoki, Kawasaki (JP); Soichi Owa, Setagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/030,822

(22) PCT Filed: Jul. 16, 1999

(86) PCT No.: PCT/JP99/03862

§ 371 (c)(1),
(2), (4) Date: Jan. 16, 2002

(87) PCT Pub. No.: WO01/06548

PCT Pub. Date: Jan. 25, 2001

(51) Int. Cl.[7] .................... G03B 27/42; G03B 27/52
(52) U.S. Cl. ........................ 355/30; 355/53
(58) Field of Search ............... 355/30, 53, 76, 355/77

(56) References Cited

U.S. PATENT DOCUMENTS

| | | | | |
|---|---|---|---|---|
| 3,310,356 | A | * | 3/1967 | Borberg et al. ............ 359/509 |
| 3,321,265 | A | * | 5/1967 | Clave et al. ............... 359/509 |
| 4,477,183 | A | * | 10/1984 | Kawamura et al. ........... 355/55 |
| 4,699,505 | A | * | 10/1987 | Komoriya et al. ........... 355/30 |
| 4,704,348 | A | | 11/1987 | Koizumi et al. |
| 4,786,947 | A | * | 11/1988 | Kosugi et al. ............. 355/30 |
| 4,801,352 | A | | 1/1989 | Piwczyk |
| 4,901,668 | A | * | 2/1990 | Murakami ................. 118/722 |
| 5,025,284 | A | | 6/1991 | Komoriya et al. |
| 5,063,582 | A | * | 11/1991 | Mori et al. ............... 378/34 |
| 5,087,927 | A | | 2/1992 | Thomas et al. |
| 5,103,102 | A | | 4/1992 | Economou et al. |
| 5,134,436 | A | * | 7/1992 | Fujioka .................. 355/30 |
| 5,559,584 | A | | 9/1996 | Miyaji et al. |
| 5,877,843 | A | | 3/1999 | Takagi et al. |
| 5,973,764 | A | * | 10/1999 | McCullough et al. ......... 355/30 |
| 5,997,963 | A | * | 12/1999 | Davison et al. ............ 427/582 |
| 6,133,982 | A | * | 10/2000 | Inoue et al. .............. 355/30 |
| 6,153,044 | A | * | 11/2000 | Klebanoff et al. .......... 156/345.3 |
| 6,208,406 | B1 | | 3/2001 | Nakashima ................ 455/30 |
| 6,313,953 | B1 | | 11/2001 | Dallas |
| 6,538,716 | B2 | | 3/2003 | Mulkens et al. |
| 6,731,371 | B1 | | 5/2004 | Shiraishi |
| 2002/0057422 | A1 | | 5/2002 | Arakawa |
| 2002/0145711 | A1 | | 10/2002 | Magome et al. ............. 455/30 |
| 2003/0006380 | A1 | | 1/2003 | Van Empel et al. .......... 250/492.3 |

FOREIGN PATENT DOCUMENTS

| | | |
|---|---|---|
| EP | 1 098 225 A2 | 5/2001 |
| EP | 1 098 226 A2 | 5/2001 |
| JP | A 60-42827 | 3/1985 |
| JP | A 60-133728 | 7/1985 |

(Continued)

*Primary Examiner*—Rodney Fuller
(74) *Attorney, Agent, or Firm*—Oliff & Berridge PLC

(57) ABSTRACT

An exposure method and an exposure apparatus make it possible to easily supply a gas through which an exposure light beam is transmitted, to a space between a projection optical system and a substrate. A wafer is exposed with an image of a pattern on a reticle by radiating the exposure light beam having passed through the pattern on the reticle, onto the wafer via a projection optical system. A purge guide plate, which has a guide hole, is installed between the wafer and an optical member disposed at the tip of the projection optical system. A purge gas, through which the exposure light beam is transmitted, is supplied to the space between the wafer and the optical member. The purge gas flows through the guide hole toward the wafer, and then flows in directions toward the outer circumference.

30 Claims, 8 Drawing Sheets

FOREIGN PATENT DOCUMENTS

| | | | |
|---|---|---|---|
| JP | A 62-63428 | 3/1987 |
| JP | A 62-272259 | 11/1987 |
| JP | A 2-250309 | 10/1990 |
| JP | A 3-127814 | 5/1991 |
| JP | A 4-273116 | 9/1992 |
| JP | A 5-304084 | 11/1993 |
| JP | A 6-260385 | 9/1994 |
| JP | A 9-260257 | 10/1997 |
| JP | A 10-97990 | 4/1998 |
| JP | B2 2888353 | 2/1999 |
| JP | A 11-111585 | 4/1999 |
| JP | A 11-238669 | 8/1999 |
| WO | WO 01/06548 A1 | 1/2001 |
| WO | WO 01/84241 A1 | 11/2001 |

* cited by examiner

EXPOSURE METHOD AND SYSTEM

TECHNICAL FIELD

The present invention relates to an exposure method and an exposure apparatus to be used when a predetermined pattern is transferred onto a substrate in the lithography step for producing devices including, for example, semiconductor elements (for example, CPU and DRAM), image pickup elements (for example, CCD), liquid crystal display elements, plasma display elements, and thin film magnetic heads. Especially, the present invention is preferably used when a vacuum ultraviolet light beam (VUV light beam) having a wavelength of about 200 nm or less is used as an exposure light beam.

BACKGROUND ART

At present, the KrF excimer laser light beam (wavelength: 248 nm) is principally used as the exposure light beam for the projection exposure apparatus based on, for example, the stepper type or the step-and-scan system to be used, for example, when a semiconductor integrated circuit is produced. Further, the use of the ArF excimer laser light beam (wavelength: 193 nm) will be started in near future as well. Investigation is also made for the development of an exposure apparatus which uses the fluorine laser beam ($F_2$ laser beam) having a wavelength of 157 nm as the exposure light beam, in order to respond to the advance of finer semiconductor elements or the like.

However, also in the case of the vacuum ultraviolet region in which the wavelength is substantially not more than about 200 nm, and in the case of the light beam having a wavelength of not more than about 180 nm as in the $F_2$ laser beam, the light is absorbed in an extremely large amount, for example, by molecules of oxygen, hydrogen, carbon dioxide gas, organic matters, and halides (hereinafter referred to as "light-absorbing substance") which are abundantly contained in the ordinary air. Therefore, in order to obtain a desired illuminance (light amount), for example, on a wafer as a substrate to be exposed, it is necessary to sufficiently decrease the concentration of the light-absorbing substance so that the transmittance of the optical path for the exposure light beam is increased. In the case of oxygen, the amount of absorption is increased as the wavelength is decreased from about 200 nm. Therefore, in an exposure apparatus which uses the vacuum ultraviolet light as the exposure light beam, it is necessary to fill the optical path for the exposure light beam with a purge gas such as high purity nitrogen gas in which the light-absorbing substance as described above is scarcely contained.

When it is intended that the purge gas, in which the amount of the light-absorbing substance is greatly reduced, is supplied to the optical path for the exposure light beam in the exposure apparatus as described above, it is easy to provide a tightly enclosed structure, for example, for the illumination optical system and the projection optical system wherein it is relatively easy to maintain a high purity of the purge gas. On the other hand, in the case of the wafer stage section and the reticle stage section, some movable units exist, and it is necessary to exchange the wafer and the reticle as the mask. Therefore, it is necessary that the wafer stage section and the reticle stage section are capable of making any access to the outside, in which it is not easy to maintain a high purity of the purge gas.

Especially, in order to realize a high throughput, it is necessary for the wafer stage to frequently make access to the outside. Further, the photoresist, which is applied onto the wafer, generates the release gas (out gas) containing organic matters and halides which are included in the light-absorbing substance as described above and which absorb a large amount of the $F_2$ laser beam. Further, the light-absorbing substance such as oil is continuously generated, for example, from wirings and movable members including, for example, stepping motors and linear motors which are installed in the vicinity of the wafer stage in many cases. Because there are several difficulties as described above, it has been difficult to fill the space (hereinafter referred to as "working distance region") between the wafer and the tip of the projection optical system with the high purity purge gas.

In relation to the above, it is also conceived that the wafer stage is covered with walls and the internal space thereof (wafer chamber) is filled with the purge gas, as a method for purging the surroundings of the wafer stage including the working distance region with the high purity purge gas. However, in the case of this method, the following procedure is required. That is, a preparatory chamber, which is provided with double-entry doors, is provided between the outside and the wafer chamber for putting in and out the wafer. The wafer is loaded on the wafer stage after the air around the wafer is substituted with the purge gas in the preparatory chamber. Such a procedure involves the following inconvenience. That is, the mechanism is complicated, and the apparatus is expensive. Further, a long period of time is required to perform the gas substitution, and the throughput is lowered.

Usually, the position of the wafer stage is measured by a laser interferometer. However, it is feared that the measured value obtained by the laser interferometer may be varied due to any fluctuation of the optical path for the laser beam. In relation to the above, for example, when the wafer stage is moved during the process in which the high purity purge gas is supplied to the surroundings of the wafer stage including the working distance region, then the state of the flow of the purge gas is changed, and the fluctuation of the optical path for the laser beam takes place. As a result, it is feared that the positioning accuracy of the wafer stage may be decreased. The amount of decrease of the positioning accuracy is extremely small. However, in view of the fact that the degree of integration of the semiconductor element or the like will be further improved in future, it is desirable to suppress the amount of decrease of the positioning accuracy as described above as well.

Taking the foregoing points into consideration, a first object of the present invention is to provide an exposure method which makes it possible to maintain a high intensity of an exposure light beam on a substrate as an exposure objective.

A second object of the present invention is to provide an exposure method which makes it possible to easily supply a gas through which an exposure light beam is transmitted, to the space between a projection optical system and a substrate as an exposure objective.

A third object of the present invention is to provide an exposure method which makes it possible to avoid any decrease in positioning accuracy of a stage for positioning a substrate as an exposure objective when a gas, through which an exposure light beam is transmitted, is supplied to the space between a projection optical system and the substrate as the exposure objective.

A fourth object of the present invention is to provide an exposure apparatus which makes it possible to carry out the exposure method as described above, and a method for producing a device, which makes it possible to produce the device with a high throughput by using the exposure method as described above.

DISCLOSURE OF THE INVENTION

A first exposure method according to the present invention resides in an exposure method for exposing a second object via a projection optical system with an exposure light beam having passed through a pattern on a first object; the exposure method comprising supplying a gas through which the exposure light beam is transmitted, from a tip or interior of the projection optical system toward an exposure area on the second object.

According to the present invention as defined above, the gas, through which the exposure light beam is transmitted, is supplied particularly and predominantly to the space in the vicinity of the exposure area on the second object. Therefore, for example, even when a photosensitive material is applied onto the second object, and the light-absorbing substance, which absorbs the exposure light beam, is generated as the release gas from the photosensitive material, then the light-absorbing substance flows to the surroundings. The transmittance of the optical path for the exposure light beam is maintained to be high, and no cloudy substance adheres to the optical member disposed at the tip of the projection optical system. Further, it is also possible to improve the uniformity of the refractive index distribution in the optical path for the exposure light beam with which the exposure area is exposed. Therefore, the image formation characteristics of the projection optical system are maintained in a well-suited manner, and it is possible to enhance, for example, the line width uniformity of a circuit pattern to be formed on the second object. Further, the intensity of the exposure light beam is increased on the second object, and the throughput is improved.

For example, when the gas, through which the exposure light beam is transmitted, is supplied from the interior of the projection optical system onto the second object, the gas can be easily supplied to the space between the second object and the projection optical system.

In another aspect, a second exposure method according to the present invention resides in an exposure method for exposing a second object via a projection optical system with an exposure light beam having passed through a pattern on a first object; the exposure method comprising supplying a gas through which the exposure light beam is transmitted, to a space between the projection optical system and the second object; and controlling a state of flow of the gas depending on a position of a stage for positioning the second object.

According to the present invention as defined above, when the position of the stage is measured, for example, with an interferometer, a measuring light beam is radiated onto the stage. In this situation, for example, the flow of the gas through which the exposure light beam is transmitted is controlled so that the fluctuation of the light beam is suppressed on the optical path when the optical path for the light beam of the interferometer approaches the projection optical system. Accordingly, it is possible to avoid the decrease in positioning accuracy of the stage.

In still another aspect, a first exposure apparatus according to the present invention resides in an exposure apparatus for exposing a second object via a projection optical system with an exposure light beam having passed through a pattern on a first object; the exposure apparatus comprising a guide member which is arranged between the second object and the projection optical system and which is provided with an aperture for allowing the exposure light beam having passed through the projection optical system to pass therethrough; and a gas supply unit which supplies a gas through which the exposure light beam is transmitted, through the aperture of the guide member toward the second object. According to the exposure apparatus, the first exposure method of the present invention can be carried out.

An optical member of the projection optical system, which is disposed at a position closest to the second object, is also used as the guide member. In this case, even when the working distance of the projection optical system is short, the gas, through which the exposure light beam is transmitted, can be supplied onto the second object with ease.

In still another aspect, a second exposure apparatus according to the present invention resides in an exposure apparatus for exposing a second object via a projection optical system with an exposure light beam having passed through a pattern on a first object; the exposure apparatus comprising a stage which positions the second object; a gas supply unit which supplies a gas through which the exposure light beam is transmitted, to a space between the projection optical system and the second object; and a control unit which controls a state of flow of the gas supplied by the gas supply unit, depending on a position of the stage. According to the exposure apparatus as defined above, the second exposure method of the present invention can be carried out.

In still another aspect, a method for producing the first exposure apparatus according to the present invention resides in a method for producing an exposure apparatus for exposing a second object via a projection optical system with an exposure light beam having passed through a pattern on a first object; the production method comprising arranging the projection optical system; arranging a guide member provided with an aperture for allowing the exposure light beam having passed through the projection optical system to pass therethrough, at an end of the projection optical system on a side of the second object; and arranging a gas supply unit for supplying a gas through which the exposure light beam is transmitted, toward the second object through the aperture of the guide member.

In still another aspect, a method for producing the second exposure apparatus according to the present invention resides in a method for producing an exposure apparatus for exposing a second object via a projection optical system with an exposure light beam having passed through a pattern on a first object; the production method comprising arranging the projection optical system and a stage for positioning the second object; arranging a gas supply unit for supplying a gas through which the exposure light beam is transmitted, between the projection optical system and the second object; and arranging a control unit for controlling a state of flow of the gas supplied by the gas supply unit, depending on a position of the stage. According to the methods for producing the first and second exposure apparatuses of the present invention as defined above, it is possible to efficiently produce the first and second exposure apparatuses of the present invention respectively.

In still another aspect, a method for producing a device according to the present invention resides in a method for producing a device, comprising the step of transferring a device pattern onto a workpiece by using the exposure method of the present invention. When the exposure method of the present invention is used, it is possible to mass-produce the device having high function at a high throughput.

BEST MODE FOR CARRYING OUT THE INVENTION

A preferred first embodiment of the present invention will be explained below with reference to FIGS. 1 to 3. In this embodiment, the present invention is applied to a projection exposure apparatus based on the step-and-scan system to use a vacuum ultraviolet light beam as the exposure light beam.

Figure 1:
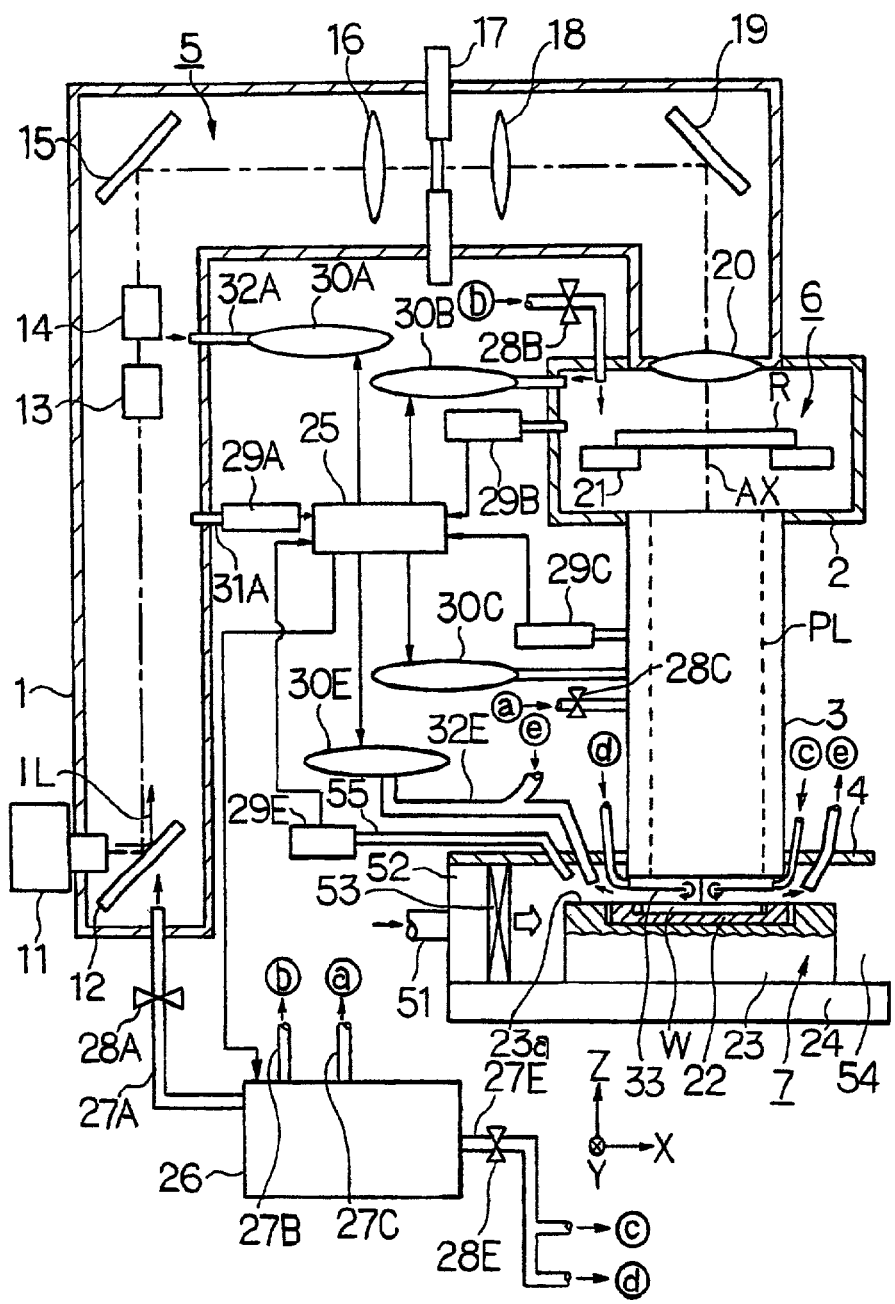
FIG. 1 shows, with partial cutout, an arrangement illustrating a projection exposure apparatus according to a first embodiment of the present invention.

FIG. 1 shows, with partial cutout, a schematic arrangement illustrating the projection exposure apparatus of this embodiment. With reference to FIG. 1, the mechanical section of the projection exposure apparatus of this embodiment is roughly classified into an illumination optical system unit 5, a reticle-operating unit 6, a projection optical system PL, and a wafer-operating unit 7. Further, the illumination optical system unit 5, the reticle-operating unit 6, and the projection optical system PL are accommodated in an illumination system chamber 1, a reticle chamber 2, and a lens barrel 3 each having a box-shaped configuration in a state in which the illumination optical system unit 5, the reticle-operating unit 6, and the projection optical system PL are isolated from the ambient gas and they are enclosed substantially strictly. The gas, which is temperature-controlled, is locally supplied to the wafer-operating unit 7 from the side surface direction. The predetermined gas is also supplied at the central portion of the wafer-operating unit 7 as described later on. Further, the entire projection exposure apparatus of this embodiment is accommodated in one large chamber (not shown) in which the temperature of the internal gas (for example, cleaned dry air) is controlled to be within a predetermined target range.

At first, in the illumination optical system unit 5, an $F_2$ laser light source, which generates a pulse laser light beam having a wavelength of 157 nm in the vacuum ultraviolet region, is used as an exposure light source 11. The light-outgoing end of the exposure light source 11 is inserted into a lower portion of the side surface of the illumination system chamber 1. The exposure light beam IL (exposure beam), which is radiated into the illumination system chamber 1 from the exposure light source 11 during the exposure, is reflected upwardly by a mirror 12, and the exposure light beam IL comes into a fly's eye lens (or a rod lens) 14 as an optical integrator (homogenizer) via an unillustrated automatic tracking section for making adjustment against any discrepancy of the optical axis caused by the vibration or the like and a beam-shaping optical system 13 for shaping the cross-sectional configuration of the illumination system and controlling the light amount. An aperture diaphragm (not shown) is arranged at the light-outgoing plane of the fly's eye lens 14. The exposure light beam IL, which is radiated from the fly's eye lens 14 and which has passed through the aperture diaphragm, is reflected substantially horizontally by a mirror 15, and the exposure light beam IL arrives at a field diaphragm (reticle blind) 17 via a relay lens 16.

The arrangement plane of the field diaphragm 17 is substantially conjugate with the pattern plane of the reticle R. The field diaphragm 17 is provided with a fixed blind for defining a slender and rectangular shape of the illumination area on the pattern plane, and a movable blind for closing the illumination area in order to avoid any exposure on unnecessary portions upon the start and the end of the scanning exposure. The exposure light beam IL, which has passed through the field diaphragm 17, illuminates, with a uniform illuminance distribution, the rectangular (slit-shaped) illumination area on the pattern plane of the reticle R via a relay lens 18, a mirror 19, and a condenser lens system 20 fixed at the tip of the illumination system chamber 1. The illumination optical system unit 5 is constructed by the components ranging from the exposure light source 11 to the condenser lens system 20. The optical path for the exposure light beam IL in the illumination optical system unit 5, i.e., the optical path ranging from the exposure light source 11 to the condenser lens system 20 is tightly enclosed by the illumination system chamber 1.

Under the illumination light beam IL, an image of the pattern in the illumination area on the reticle R is projected onto the wafer W applied with photoresist as the substrate, at a projection magnification β (β is, for example, ¼ or ⅕) via the projection optical system PL. The wafer W is, for example, a disk-shaped substrate of semiconductor (for example, silicon) or SOI (silicon on insulator). When the exposure light beam IL is the $F_2$ laser beam as in this embodiment, the optical glass material, which has a satisfactory transmittance, is limited, for example, to fluorite (crystal of $CaF_2$), quartz glass doped with, for example, fluorine or hydrogen, and magnesium fluoride ($MgF_2$). Therefore, it tends to be difficult to obtain desired image formation characteristics (for example, chromatic aberration characteristic) by constructing the projection optical system with only refractive optical members. Accordingly, the projection optical system PL of this embodiment is a catadioptric system obtained by combining refractive optical members and reflecting mirrors as described later on. The following description will be made assuming that the Z axis extends in parallel to the optical axis AX of the projection optical system PL, the X axis extends in parallel to the plane of paper of FIG. 1 in the plane (horizontal plane in this embodiment) perpendicular to the Z axis, and the Y axis extends perpendicularly to the plane of paper of FIG. 1. The illumination area on the reticle R of this embodiment has a rectangular shape which is slender in the X direction. The scanning direction for the reticle R and the wafer W during the exposure is the Y direction.

In this arrangement, the reticle R is held on a reticle stage 21. The reticle stage 21 continuously moves the reticle R in the Y direction on an unillustrated reticle base, and the reticle stage 21 finely drives the reticle R so that the synchronization error is reduced in the X direction, the Y direction, and the rotational direction. The position and the angle of rotation of the reticle stage 21 are measured highly accurately by an unillustrated laser interferometer. The reticle stage 21 is driven on the basis of obtained measured values and control information supplied from a main control system 25 composed of a computer for collectively controlling the operation of the entire apparatus. The reticle-operating unit 6 is constructed by the components including, for example, the reticle R, the reticle stage 21, and the reticle base and a reticle loader which are not shown. The optical path for the exposure light beam IL in the reticle-operating unit 6, i.e., the optical path ranging from the condenser lens system 20 to the projection optical system PL is tightly enclosed by the reticle chamber 2.

The projection optical system PL is accommodated in the lens barrel 3 in a tightly enclosed state. The optical path, which ranges from the optical member of the projection optical system PL disposed on the side of the reticle to the optical member disposed on the side of the wafer, is tightly enclosed in the lens barrel 3.

On the other hand, the wafer W is attracted and held on a placing plane composed of a recess on a wafer holder 22. The wafer holder 22 is fixed to a recess on a wafer stage 23. The surface 23a of the wafer stage 23 is arranged on a substantially identical plane together with the surface of the wafer W and the surface of the wafer holder 22. Accordingly, the gas is capable of smoothly flowing over the surface of the wafer W. The wafer stage 23 continuously moves the wafer W in the Y direction on a wafer base 24, and the wafer stage 23 moves the wafer W in a stepping manner in the X direction and the Y direction. The wafer stage 23 is also operated such that the surface of the wafer W is focused with the image plane of the projection optical system PL in accordance with the autofocus system on the basis of information on the position (focus position) of the surface of the wafer W in the direction of the optical axis AX measured by unillustrated autofocus sensors (autofocus sensors 63, 64 shown in FIG. 3). The positions in the X direction and the Y direction, the angle of rotation about the X axis (pitching amount), the angle of rotation about the Y axis (rolling amount), and the angle of rotation about the Z axis (yawing amount) of the wafer stage 23 are measured highly accurately by unillustrated laser interferometers. The wafer stage 23 is driven on the basis of obtained measured values and control information supplied from the main control system 25.

The wafer-operating unit 7 is constructed by the wafer W, the wafer holder 22, the wafer stage 23, and the wafer base 24. The wafer loader and other components (not shown) are arranged in the +X direction of the wafer-operating unit 7.

The upper portion of the wafer-operating unit 7 and the side surface of the projection optical system PL are covered with a cover 4. A blower unit 52 and a dust-removing filter unit 53 are arranged in the side surface direction in the −X direction of the wafer-operating unit 7. The dry air, which is temperature-controlled and from which ozone is removed, is supplied from an unillustrated gas supply unit via a piping 51 to the blower unit 52. The blower unit 52 feeds the dry air to the surroundings of the wafer-operating unit 7 under the cover 4 via the filter unit 53, at a flow rate corresponding to control information supplied from the main control system 25. Accordingly, the temperature of the wafer-operating unit 7 is approximately maintained at a predetermined target temperature. An open section 54 is provided on the side surface of the cover 4 in the +X direction. Therefore, the wafer W can be easily exchanged through the open section 54. An inert gas (for example, rare gas such as helium gas, or nitrogen gas), which has a high transmittance with respect to the exposure light beam IL, may be supplied as the gas to be supplied from the blower unit 52 to the wafer-operating unit 7.

When an arrangement is arranged, in which the dry air or the like, from which dust, chemical substances and the like are removed, is allowed to continuously flow, for example, in accordance with the downflow in the chamber in which the projection exposure apparatus of this embodiment is accommodated as a whole, the temperature of the wafer-operating unit 7 is stabilized to a certain extent. Accordingly, in the case of such an arrangement, the cover 4, the blower unit 52, and the filter unit 53, which are used to locally supply the dry air or the like to the surroundings of the wafer-operating unit 7, may not be arranged.

During the exposure, the operation for moving a shot area as an exposure objective on the wafer W to a position in front of the exposure area of the projection optical system PL in a stepping manner, and the operation for scanning the wafer W in the Y direction at a constant velocity $\beta \cdot VR$ ($\beta$ represents the projection magnification of the projection optical system PL) by the aid of the wafer stage 23 in synchronization with the scanning of the reticle R in the Y direction at a constant velocity VR with respect to the illumination area of the exposure light beam IL by the aid of the reticle stage 21 are repeated in accordance with the step-and-scan system. The reduced image of the pattern on the reticle R is successively transferred onto each of the shot areas on the wafer W.

The exposure light beam IL of this embodiment is a vacuum ultraviolet light beam having a wavelength of 157 nm. Therefore, the light-absorbing substance for the exposure light beam IL in the ordinary air from which ozone is removed includes, for example, oxygen ($O_2$) water (steam: $H_2O$), carbon dioxide gas (carbon dioxide: $CO_2$), organic matters, and halides. On the other hand, the gas (substance scarcely causes absorption), through which the illumination light beam IL is transmitted, includes nitrogen gas ($N_2$) as well as rare gas including helium (He), neon (Ne), argon (Ar), krypton (Kr), xenon (Xe), and radon (Rn). The nitrogen gas and the rare gas are collectively referred to as "inert gas".

The nitrogen gas acts as a light-absorbing substance for the light beam having a wavelength of not more than about 150 nm. However, the helium gas can be used as the transmissive gas up to a wavelength of about 100 nm. Further, the coefficient of thermal conductivity of the helium gas is about six times that of the nitrogen gas, and the amount of variation of the refractive index with respect to the change of atmospheric pressure is about ⅛ of that of the nitrogen gas. Therefore, the helium gas is excellent especially in high transmittance as well as in cooling performance and stability of the image formation characteristics of the optical system. However, the helium gas is expensive. Therefore, when the wavelength of the exposure light beam is not less than 150 nm as in the $F_2$ laser, the nitrogen gas may be used as the transmissive gas in order to reduce the running cost. In this embodiment, the helium gas is used as the gas (hereinafter referred to as "purge gas") through which the exposure light beam IL is transmitted, in view of, for example, the cooling performance and the stability of the image formation characteristics.

Vacuum pumps 30A, 30B, 30C, which are provided in order to discharge the internal gas including the light-absorbing substance, for example, via a piping 32A, are connected in the illumination system chamber 1, the reticle chamber 2, and the lens barrel 3 of this embodiment. Further, for example, the helium gas as the purge gas, which is compressed in a high purity state or which is liquefied, is stored in a bomb in the gas supply unit 26 installed at the outside of the chamber (not shown) in which the entire projection exposure apparatus of this embodiment is accommodated. The helium gas, which is taken out of the bomb if necessary, is controlled to have a predetermined pressure and a predetermined temperature, and the helium gas is supplied to the interior of the illumination system chamber 1, the reticle chamber 2, and the lens barrel 3 via pipings 27A, 27B, 27C attached with electromagnetically openable/closable valves 28A, 28B, 28C.

Concentration sensors 29A, 29B, 29C, which are provided to measure the concentration of the light-absorbing substance, are connected at the inside of the illumination system chamber 1, the reticle chamber 2, and the lens barrel 3, for example, via a piping 31A. Measured values obtained by the concentration sensors 29A to 29C are supplied to the main control system 25. Those usable as the concentration sensors 29A to 29C include, for example, compound sensors obtained by combining, for example, oxygen concentration meters, dew point recorders as concentration meters for steam, and sensors for carbon dioxide. When the concentration of the predetermined light-absorbing substance (oxygen, steam, and carbon dioxide in this embodiment), which is measured by each of the concentration sensors 29A, 29B, 29C, exceeds a previously set allowable concentration, the gas and the light-absorbing substance, which are contained in the illumination system chamber 1, the reticle chamber 2, and the lens barrel 3, are discharged by the main control system 25 by operating the vacuum pumps 30A, 30B, 30C in the state in which the respective valves 28A, 28B, 28C are closed. After that, the high purity purge gas at a predetermined temperature, is supplied until a predetermined pressure is achieved (normally 1 atom) to the interior of the illumination system chamber 1, the reticle chamber 2, or the lens barrel 3, by opening the valve 28A, 28B, or 28C and operating the gas supply unit 26 by the main control system 25 via a piping 27A to a piping 27c. Accordingly, the internal pressure of the illumination system chamber 1, the reticle chamber 2, or the lens barrel 3 becomes substantially equal to the pressure of the external air. After that, the valve 28A, 28B, or 28C is closed. The concentration of the light-absorbing substance at the inside of the corresponding illumination system chamber 1, the reticle chamber 2, or the lens barrel 3 is not more than the allowable concentration respectively until a predetermined period of time elapses from the operation described above.

A purge guide plate 33 as the guide member of the present invention, which has an aperture formed at a central portion, is installed at the working distance region as defined between the wafer W and the optical member disposed at the tip of the projection optical system PL of this embodiment. A gas supply tube, which is communicated with a piping 27E equipped with an openable/closable valve 28E from the gas supply unit 26, is arranged between the tip of the projection optical system PL and the purge guide plate 33. A plurality of gas discharge tubes, which are arranged at the outside of the space between the purge guide plate 33 and the wafer W, are connected to a piping 32E through the cover 4. The piping 32E is connected to a vacuum pump 30E. Further, a piping 55, which is arranged in the vicinity of the outer circumference of the purge guide plate 33, is connected to a concentration sensor 29E (constructed in the same manner as the concentration sensor 29A) through the cover 4. The main control system 25 controls the amount of supply of the purge gas toward the purge guide plate 33 supplied by the gas supply unit 26, and the amount of discharge of the gas discharged by the vacuum pump 29E, on the basis of, for example, the measured value obtained by the concentration sensor 29E. In this embodiment, it is possible to omit the operation for discharging the purge gas and the air effected by the vacuum pump 29E. When the gas-discharging operation is not performed all the time, the discharge system including, for example, the vacuum pump 29E may not be provided.

Detailed explanation will be made with reference to FIGS. 2 and 3 for the mechanism for supplying the purge gas to the space between the projection optical system PL and the wafer W. In FIG. 2 and the followings, the cover 4 shown in FIG. 1 is omitted from the illustration.

Figure 2:
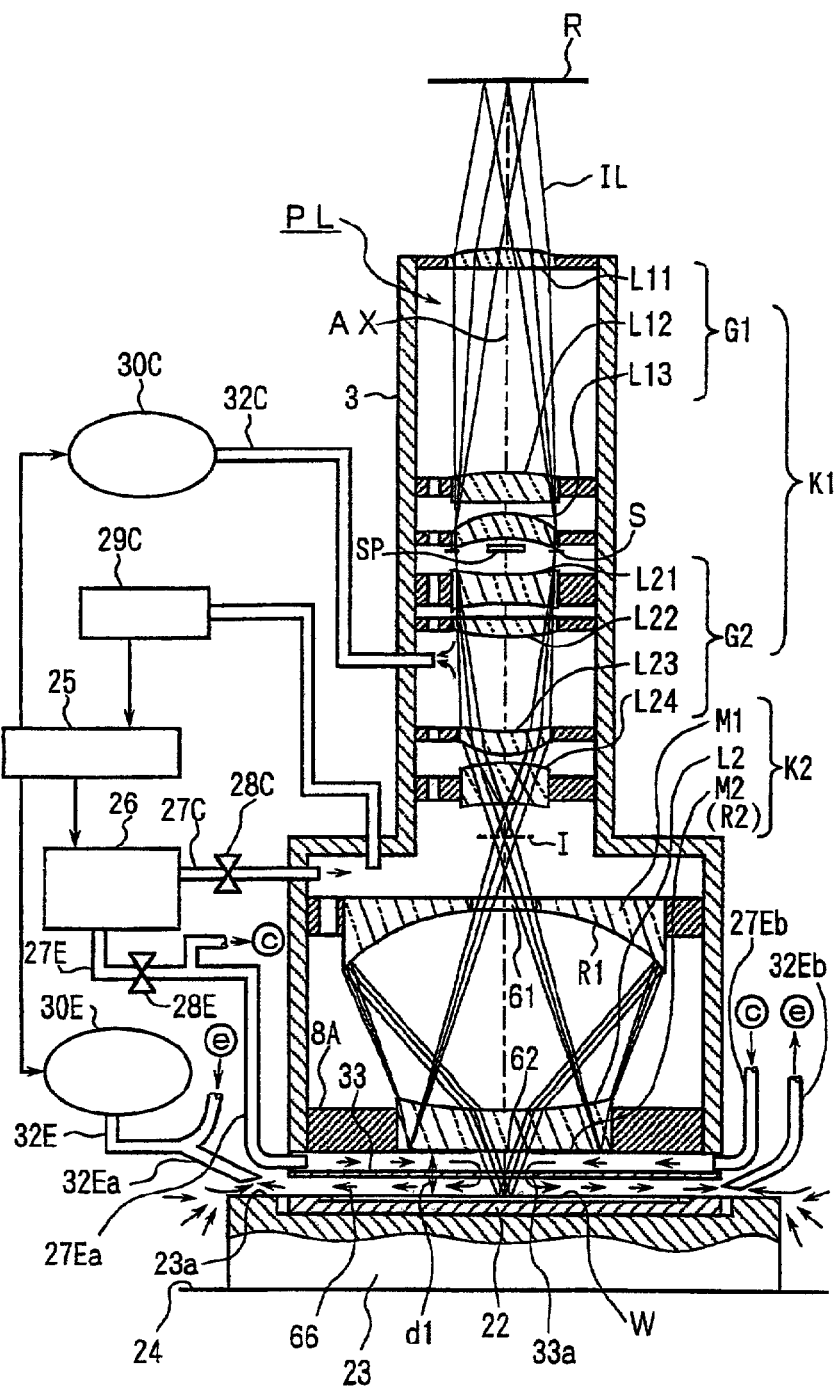
FIG. 2 shows, with partial cross section, an arrangement of those ranging from a projection optical system PL to a wafer stage 23 shown in FIG. 1.

FIG. 2 shows a sectional view illustrating an internal arrangement of those ranging from the projection optical system PL to the wafer stage 23 shown in FIG. 1. With reference to FIG. 2, the projection optical system PL, which is composed of the cata-dioptric system of this embodiment, is constructed by a first image-forming optical system K1 for forming a primary image (intermediate image) I of the pattern on the reticle R, and a second image-forming optical system K2 for forming a secondary image of the reticle pattern with a reduction magnification on the wafer W as the photosensitive substrate on the basis of the light beam coming from the primary image I.

The first image-forming optical system K1 comprises, in an order from the reticle side, a first lens group G1 having a positive refracting power, an aperture diaphragm S, and a second lens group G2 having a positive refracting power. The first lens group G1 comprises, in an order from the reticle side, a positive meniscus lens L11 having a non-spherical convex surface directed to the reticle side, a positive meniscus lens L12 having a non-spherical convex surface directed to the reticle side, and a positive meniscus lens L13 having a non-spherical concave surface directed to the wafer side. The second lens group G2 comprises, in an order from the reticle side, a biconcave lens L21 having a surface on the reticle side formed to be non-spherical, a biconvex lens L22 having a surface on the reticle side formed to be non-spherical, a positive meniscus lens L23 having a non-spherical convex surface directed to the wafer side, and a positive meniscus lens L24 having a non-spherical concave surface directed to the wafer side. Further, a circular center shield member SP for shielding the light beam in the vicinity of the optical axis AX is arranged at a position separated by a predetermined spacing distance from the aperture diaphragm S in the direction of the optical axis AX.

On the other hand, the second image-forming optical system K2 comprises, in an order from the reticle side, a primary mirror M1 which has a surface reflection surface R1 with a concave surface directed to the wafer side and which has a central aperture (light-transmitting section) 61, a lens component L2, and a secondary mirror M2 which is provided on the lens surface on the wafer side of the lens component L2 and which is provided with a reflection surface R2 having a central aperture 62. That is, from another viewpoint, a back surface reflecting mirror is constructed by the secondary mirror M2 and the lens component L2, and the lens component L2 constitutes a refracting section of the back surface reflecting mirror. In this arrangement, for example, it is desirable to satisfy a relationship of $0.7 < |\beta1/\beta2| < 3.5$ provided that $\beta1$ represents the image formation magnification of the first image-forming optical system K1, and $\beta2$ represents the image formation magnification of the second image-forming optical system K2.

All of the optical elements (G1, G2, M1, M2), which constitute the projection optical system PL, are arranged along the single optical axis AX. The primary mirror M1 is arranged in the vicinity of the position of formation of the primary image I. The secondary mirror M2 is arranged closely to the wafer W.

Thus, in this embodiment, the light beam from the pattern on the reticle R forms the primary image (intermediate image) I of the reticle pattern via the first image-forming optical system K1. The light beam from the primary image I is reflected by the primary mirror M1 via the central aperture 61 of the primary mirror M1 and the lens component L2. The light beam, which is reflected by the primary mirror M1, forms, at a reduction magnification, a secondary image of the reticle pattern on the surface of the wafer W via the lens component L2 and the central aperture 62 of the secondary mirror M2. In the illustrative embodiment shown in FIG. 2, the image formation magnification $\beta 1$ of the first image-forming optical system K1 is 0.6249, and the image formation magnification $\beta 2$ of the second image-forming optical system K2 is 0.4000. The projection magnification $\beta$ from the reticle R to the wafer W is 0.25 (¼-fold).

In this embodiment, fluorite (crystal of $CaF_2$) is used for all of the refractive optical members (lens components) for constructing the projection optical system PL. The oscillation central wavelength of the $F_2$ laser beam as the exposure light beam is 157.6 nm. The chromatic aberration is corrected for the light beam having a wavelength width of 157.6 nm±10 pm. Further, various aberrations including, for example, the spherical aberration, the astigmatism, and the distortion aberration are also corrected in a well-suited manner. Further, in order to maintain the good image formation performance by suppressing the surface change of the reflection surface of the primary mirror M1 with respect to the temperature change, the support member for supporting the reflection surface R1 of the primary mirror M1 is formed with a substance having a coefficient of linear expansion of not more than 3 ppm/° C., for example, titanium silicate glass. Those usable as the titanium silicate glass include, for example, ULE (Ultra Low Expansion: trade name) produced by Corning.

In the projection optical system PL of this embodiment, all of the optical elements for constructing the cata-dioptric optical system are arranged along the single optical axis. Therefore, for example, the chromatic aberration can be reduced by using the reflecting member. Further, the lens barrel can be designed and produced by a technique which may be readily anticipated from the conventional normal cylinder type refracting system. It is possible to realize a high accuracy without suffering from any difficulty in production.

In this embodiment, the first image-forming optical system K1 and the second image-forming optical system K2 are supported in a state of being tightly enclosed in the single lens barrel 3. That is, the lenses L11 to L24, the primary mirror M1, and the lens component L2 (secondary mirror M2) are held in the lens barrel 3 by the aid of lens frames respectively. A ventilation hole for allowing the gas to pass therethrough is formed through each of the lens frames for the optical members ranging from the lens L12 to the primary mirror M1. The lens frame for the lens L11 disposed at the uppermost stage and the lens frame 8A for the lens component L2 (secondary mirror M2) disposed at the lowermost stage (tip portion) are tightly enclosed respectively.

As having been explained with reference to FIG. 1, the piping communicating with the concentration sensor 29C, the piping 32C communicating with the vacuum pump 30C, and the piping 27C communicating with the gas supply unit 26 are connected at the inside of the lens barrel 3. The interior of the lens barrel 3 is filled with the high purity purge gas owing to the members described above.

The spacing distance of the working distance region of this embodiment, i.e., the spacing distance d1 between the wafer W and the secondary mirror M2 as the optical member disposed at the tip of the projection optical system PL is about 10 mm. The purge guide plate 33, which has a thickness of about 1 mm, is installed at an approximately middle position of the working distance region. A circular guide hole 33a, which serves as an aperture for allowing the exposure light beam IL (image-forming light flux) coming into the wafer W to pass therethrough, is formed at a central portion of the purge guide plate 33 (in the vicinity of the field center about the center of the optical axis AX in this embodiment). The guide hole 33a is used as the aperture for allowing the image-forming light flux (exposure light beam IL) as the exposure beam to pass therethrough and as the aperture for allowing the purge gas to pass therethrough.

The portion, which ranges from the outer circumference of the purge guide plate 33 to the side surface of the lens barrel 3, is tightly enclosed. Two gas supply tubes 27E$a$, 27E$b$ are arranged at the portion so that the gas supply tubes 27E$a$, 27E$b$ are opposed to one another with the optical axis AX intervening therebetween. The gas supply tubes 27E$a$, 27E$b$ are connected to the gas supply unit 26 via the piping 27E equipped with the valve 28E. Therefore, the space between the secondary mirror M2 (lens component L2) and the purge guide plate 33 resides in a tightly enclosed structure except for the guide hole 33a. A plurality of gas discharge tubes 32E$a$, 32E$b$ are installed in the vicinity of the side surface portions of the space between the purge guide plate 33 and the wafer W. The gas discharge tubes 32E$a$, 32E$b$ are connected to the vacuum pump 30E via the piping 32E.

Figure 3:
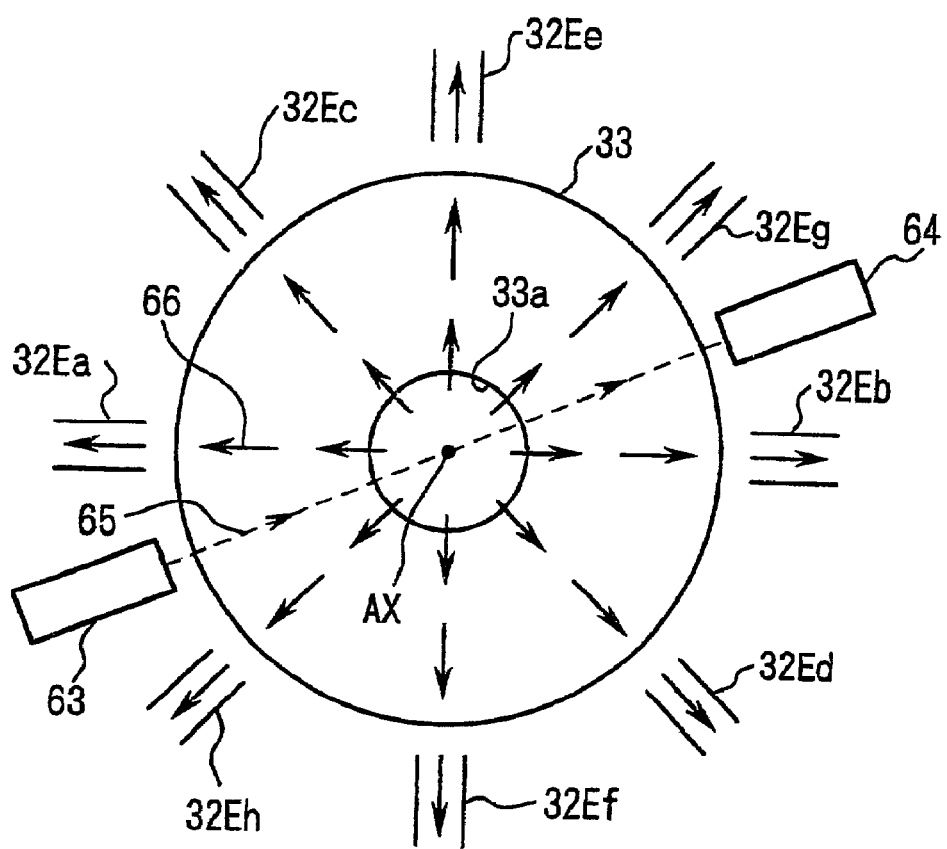
FIG. 3 shows a plan view illustrating a purge guide plate 33 shown in FIG. 2.

Actually, as shown in FIG. 3 which is a plan view of the purge guide plate 33 shown in FIG. 2, the eight gas discharge tubes 32E6i$a$ to 32E$h$ are arranged at approximately equal angle intervals at outer circumferential portions of the purge guide plate 33. The gas discharge tubes 32E$a$ to 32E$h$ are connected to the vacuum pump 30E via the piping 32E shown in FIG. 2 respectively. As shown in FIG. 3, an autofocus sensor 63, 64, which is composed of a projection optical system 63 for projecting slit images onto a plurality of measuring points on the surface of the wafer with an illumination light beam 65 and a light-collecting optical system 64 for receiving reflected light beams from the slit images to generate a focus signal including focus position information at each of the measuring points, is arranged so that the autofocus sensor 63, 64 does not make any mechanical interference with the gas discharge tubes 32E$a$ to 32E$h$.

With reference to FIG. 2 again, the arrangement of the gas supply tubes 27E$a$, 27E$b$ is not limited to the arrangement at the two positions as well. The gas supply tubes may be arranged at a plurality of positions of not less than three positions at approximately equal angle intervals around the purge guide plate 33.

In this embodiment, a first method for supplying the purge gas is adopted as follows. That is, the valve 28E is in the open state during the exposure. The high purity purge gas (helium gas in this embodiment) as the gas through which the exposure light beam IL is transmitted is continuously supplied toward the central portion between the tip of the projection optical system PL and the purge guide plate 33 from the gas supply unit 26 via the piping 27E and the gas supply tubes 27E$a$, 27E$b$. On the other hand, the operation of aspirating the purge gas or the like by the vacuum pump 30E is not performed. When the measured value of the concentration of the light-absorbing substance, which is obtained by the concentration sensor 29E shown in FIG. 1, is increased, the supply amount of the purge gas is increased.

In this procedure, the high purity purge gas, which is introduced from the gas supply tubes 27E*a*, 27E*b* into the space between the tip of the projection optical system PL and the purge guide plate 33, flows through the space toward the center of the guide hole 33*a* as the field center, and then the purge gas flows through the interior of the guide hole 33*a* toward the wafer (in the same direction as the traveling direction of the exposure light beam IL). The flow of the purge gas in the interior of the guide hole 33*a* is referred to as "downflow". The purge gas, which is subjected to the downflow as described above, outflows to the space between the purge guide plate 33 and the wafer W, and then the purge gas flows outwardly from the exposure section (central portion) as indicated by arrows 66.

During the process of the flow of the purge gas, the downflow of the purge gas occurs in the direction opposite to the ordinary diffusion direction (direction toward the projection optical system PL) of the release gas containing the light-absorbing substance generated from the wafer W, especially the release gas from the photoresist applied onto the wafer W. As a result, the release gas from the wafer W is almost prevented from counterflow toward the space over the purge guide plate 33. The release gas flows away from the field center to the surroundings as if the release gas is drawn and caught by the downflow of the purge gas. The purge gas containing the release gas generated from the wafer W, especially the release gas from the photoresist applied onto the wafer W is hereinafter referred to as "gas containing the light-absorbing substance".

As described above, in this embodiment, the decrease in transmittance, which would be otherwise caused by the adhesion of the release gas from the wafer W to the optical member disposed at the tip of the projection optical system PL, can be suppressed by means of the downflow of the gas containing the light-absorbing substance. It is possible to maintain the uniformity of the exposure light beam IL (image-forming light flux) by discharging the light-absorbing substance contained in the release gas. Accordingly, it is possible to maintain high image formation characteristics of the projection optical system PL. Consequently, it is possible to enhance the line width uniformity of the circuit pattern to be formed on the wafer W, it is possible to allow a sufficient amount of light to arrive at the exposure surface of the wafer W, and it is possible to increase the throughput of the exposure step.

Further, in this embodiment, the purge guide plate 33 forms the flat plane. The bottom surface of the optical member (secondary mirror M2) at the tip of the projection optical system PL disposed thereover, and the bottom surface of the lens frame 8A are located on a substantially identical plane parallel to the purge guide plate 33. Further, the upper surface 23*a* of the wafer stage 23 disposed under the purge guide plate 33, the upper surface of the wafer holder 22, and the exposure surface of the wafer W are located on a substantially identical plane parallel to the purge guide plate 33. Therefore, the purge gas can flow extremely smoothly through the space over and under the purge guide plate 33. The light-absorbing substance is efficiently discharged toward the outer circumferential portions.

In another viewpoint, a second method for supplying the purge gas is adopted as follows. That is, the operation is performed, in which the high purity purge gas is continuously supplied toward the center between the purge guide plate 33 and the tip of the projection optical system PL from the gas supply unit 26 via the gas supply tubes 27E*a*, 27E*b* during the exposure, concurrently with which the vacuum pump 30E is used to continuously aspirate the gas via the piping 32E and the gas discharge tubes 32E*a* to 32E*h* (see FIG. 3). When the measured value of the concentration of the light-absorbing substance, which is obtained by the concentration sensor 29E shown in FIG. 1, is increased, the supply amount of the purge gas and the aspiration amount of the gas are increased. In this embodiment, almost all of the purge gas which outflows to the outside and the dry air which flows at the outside are aspirated by the vacuum pump 30E via the gas discharge tubes 32E*a* to 32E*h*. Therefore, it is possible to prevent the gas containing the light-absorbing substance flowing through the space between the purge guide plate 33 and the wafer W from leakage from the outer circumferential portion of the wafer stage 23 to the external space.

In this procedure, it is desirable that the discharge rate of the gas (volume of the gas aspirated per unit time) with the gas discharge tubes 32E*a* to 32E*h* is set to be larger than the supply rate of the gas (volume of the gas emitted per unit time) with the gas supply tubes 27E*a*, 27E*b* for the purge gas. Accordingly, not only the gas containing the light-absorbing substance but also the atmosphere in the vicinity of the wafer stage 23 (dry air in this embodiment) are aspirated. Usually, the flow of the atmosphere is a flow in the direction directed from the wafer stage 23 toward the exposure area (central portion of the downflow of the high purity purge gas). Accordingly, the gas containing impurities is prevented from outflow from the space over the wafer stage 23 to the external space. It is possible to reduce the change of refractive index in the atmosphere at the outer circumference of the wafer stage 23 as less as possible. Accordingly, it is possible to decrease the fluctuation of the optical path for the laser beam of the laser interferometer for measuring the position of the wafer stage 23, and it is possible to improve the positioning accuracy of the wafer stage 23. Further, it is also possible to improve the measurement accuracy of the focus position of the autofocus sensor 63, 64.

The high purity purge gas can be supplied particularly and dominantly to the surroundings of the exposure section on the wafer in an efficient manner by realizing the flow of the high purity purge gas over the wafer stage 23 without disturbing the external atmosphere. Simultaneously, it is possible to further decrease the detection error which would be otherwise caused in the autofocus sensor 63, 64 and the interferometer for positioning the wafer stage 23 by any variation in refractive index due to the mixing of the high purity purge gas and the surrounding atmosphere of the wafer stage 23.

In the embodiment described above, the reticle stage 21 may be placed over the reticle base not shown in FIG. 1 by the aid of an air bearing, and the wafer stage 23 may be placed over the wafer base 24 by the aid of an air bearing. In this arrangement, it is desirable that a gas, which is obtained by once recovering the helium gas (or nitrogen gas or the like) supplied to at least one of the internal spaces of the illumination system chamber 1, the reticle chamber 2, and the lens barrel 3 of the projection optical system PL and the space over the upper surface of the wafer W, is used as a buffering gas. In this arrangement, the helium gas or the like, which is supplied to the stages, may be possibly contaminated with various impurities. Therefore, the gas may be supplied again after allowing the gas to pass through various filters for removing, for example, oxygen, water, carbon dioxide gas, organic matters, and halides.

Figure 4:
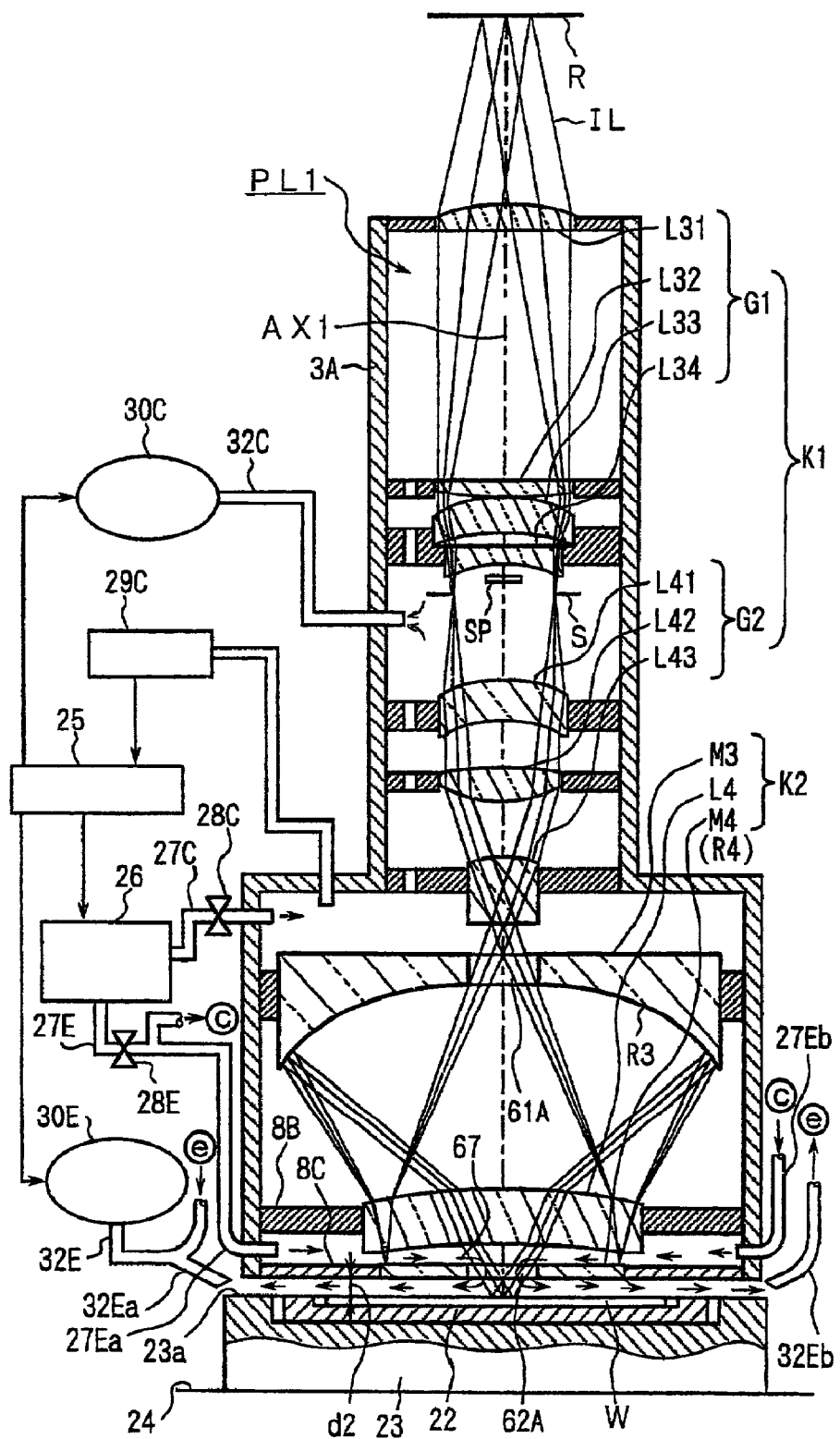
FIG. 4 shows, with partial cross section, an arrangement of those ranging from a projection optical system PL1 to a wafer stage 23 according to a second embodiment of the present invention.

Next, a second embodiment of the present invention will be explained with reference to FIG. 4. In FIG. 4, components or parts corresponding to those shown in FIGS. 1 and 2 are designated by the same reference numerals, detailed explanation of which will be omitted.

FIG. 4 shows a sectional view illustrating an arrangement of those ranging from a projection optical system PL1 to a wafer stage 23 of a projection exposure apparatus of this embodiment. In FIG. 4, an $F_2$ laser beam as a vacuum ultraviolet light beam is used for the exposure light beam IL. The projection optical system PL1 of this embodiment, which is composed of a cata-dioptric optical system, also comprises a first image-forming optical system K1 for forming an intermediate image (primary image) of the pattern on the reticle R, and a second image-forming optical system K2 of the cata-dioptric type for forming a final image of the reticle pattern with a reduction magnification on the wafer W as the photosensitive substrate on the basis of the light beam coming from the intermediate image.

The first image-forming optical system K1 comprises, in an order from the reticle side, a first lens group G1 having a positive refracting power, an aperture diaphragm S, and a second lens group G2 having a positive refracting power. The first lens group G1 comprises, in an order from the reticle side, a meniscus lens L31 having a non-spherical convex surface directed to the reticle side, a biconvex lens L32 having a non-spherical convex surface directed to the reticle side, a meniscus lens L33 having a non-spherical concave surface directed to the wafer side, and a meniscus lens L34 having a non-spherical convex surface directed to the reticle side. The second lens group G2 comprises, in an order from the reticle side, a meniscus lens L41 having a non-spherical convex surface directed to the reticle side, a biconvex lens L42 having a non-spherical convex surface directed to the wafer side, and a meniscus lens L43 having a non-spherical concave surface directed to the wafer side. A center shield member SP for shielding the light beam in the vicinity of the optical axis AX is arranged at a position different from that of the aperture diaphragm S by a predetermined spacing distance in the direction of the optical axis AX.

On the other hand, the second image-forming optical system K2 comprises, in an order from the reticle side, a primary mirror M3 which has a central aperture (light-transmitting section) 61A and which has a reflection surface R3 having a negative refracting power with a concave surface directed to the wafer side, a lens component L4, and a secondary mirror M4 which is provided with a reflection surface R4 having a central aperture 62A. The lens component L4 is a negative meniscus lens with a non-spherical concave surface directed to the wafer side. That is, all of the optical elements (G1, G2, M3, L4, M4), which constitute the projection optical system PL1, are arranged along the single optical axis AX1. The primary mirror M3 is arranged in the vicinity of the position of formation of the intermediate image. The secondary mirror M4 is arranged closely to the wafer W. In this embodiment, the exposure light beam IL (image-forming light flux) from the pattern on the reticle R forms the intermediate image by the aid of the first image-forming optical system K1. The image-forming light flux from the intermediate image passes through the aperture 61A of the primary mirror M3, and the light flux is reflected by the reflection surface R4 of the upper surface of the secondary mirror M4 via the lens component L4. After that, the light flux passes through the lens component L4, and the light flux is reflected by the reflection surface R3 of the primary mirror M4. The light flux passes through the lens component L2 and the aperture 62A of the secondary mirror M4 again, and the light flux comes into the wafer W.

In this embodiment, those ranging from the first image-forming optical system K1 to the lens component L4 of the second image-forming optical system K2 are supported in a state of being tightly enclosed in the single lens barrel 3A. That is, the lenses L31 to L43, the primary mirror M3, the lens component L4, and the secondary mirror M4 are held in the lens barrel 3A by the aid of lens frames respectively. A ventilation hole for allowing the gas to pass therethrough is formed through each of the lens frames for the optical members ranging from the lens L32 to the primary mirror M3. The lens frame for the lens L31 disposed at the uppermost stage and the lens frames 8B, 8C for the lens component L4 disposed at the lowermost stage (tip portion) and the secondary mirror M4 are tightly enclosed respectively.

In the same manner as in the first embodiment, the piping communicating with the concentration sensor 29C, the piping 32C communicating with the vacuum pump 30C, and the piping 27C communicating with the gas supply unit 26 are connected at the inside of the space including the primary mirror M4 of the lens barrel 3A. The interior of the space including the primary mirror M4 is filled with the high purity purge gas owing to the members described above.

Two gas supply tubes 27E*a*, 27E*b* are arranged at side surface portions of the lens barrel 3A between the lens component L4 and the secondary mirror M4 so that the gas supply tubes 27E*a*, 27E*b* are opposed to one another with the optical axis AX1 intervening therebetween. The gas supply tubes 27E*a*, 27E*b* are connected to the gas supply unit 26 via the piping 27E. Therefore, the space between the secondary mirror M4 and the lens component L4 resides in a tightly enclosed structure except for the aperture 62A. In this embodiment, the secondary mirror M4 also serves as the purge guide plate 33 in the first embodiment. Therefore, the aperture 62A also serves as the guide hole 33*a* in the first embodiment.

A plurality of gas discharge tubes 32E*a*, 32E*b* are installed in the vicinity of the side surface portions of the space between the secondary mirror M4 and the wafer W. The gas discharge tubes 32E*a*, 32E*b* are connected to the vacuum pump 30E via the piping 32E. Also in this embodiment, for example, the gas discharge tubes 32E*a* and 32E*b* actually have eight tubes arranged at approximately equal angle intervals. The other arrangement is the same as that of the first embodiment shown in FIG. 1.

In this embodiment, in order to supply the purge gas to the region in the vicinity of the exposure area of the wafer W, the operation is performed, in which the high purity purge gas is continuously supplied toward the center between the secondary mirror M4 and the lens component L4 of the projection optical system PL1 from the gas supply unit 26 via the gas supply tubes 27E*a*, 27E*b* during the exposure, concurrently with which the vacuum pump 30E is used to continuously aspirate the gas via the piping 32E and the gas discharge tubes 32E*a* and 32E*b*. That is, when the aperture 62A is formed for the optical member (secondary mirror M4) disposed at the tip of the projection optical system PL1 as in this embodiment, it is unnecessary to daringly install the purge guide plate. The space between the lens component L4 and the secondary mirror M4 is filled with the high purity purge gas, and the gas is further pressurized. Accordingly, the high purity purge gas causes the downflow toward the wafer W as indicated by arrows 67. The light-absorbing substance is allowed to flow toward the outer circumferential portions together with the purge gas in the same manner as in the first embodiment.

Further, in this embodiment, even when the spacing distance d2 of the working distance region between the wafer W and the optical member (secondary mirror M4) disposed at the tip of the projection optical system PL1 is narrow, it is possible to supply the high purity purge gas in a form of downflow toward the wafer W.

Further, it is possible to reduce the amount of diffusion of the gas containing the light-absorbing substance to the outer circumferential portions of the wafer stage 23 owing to the installation of the gas discharge tubes 32Ea, 32Eb for aspirating the gas containing the light-absorbing substance. It is possible to improve the positioning accuracy of the wafer stage 23 and the measurement accuracy of the autofocus sensor.

Figure 5:
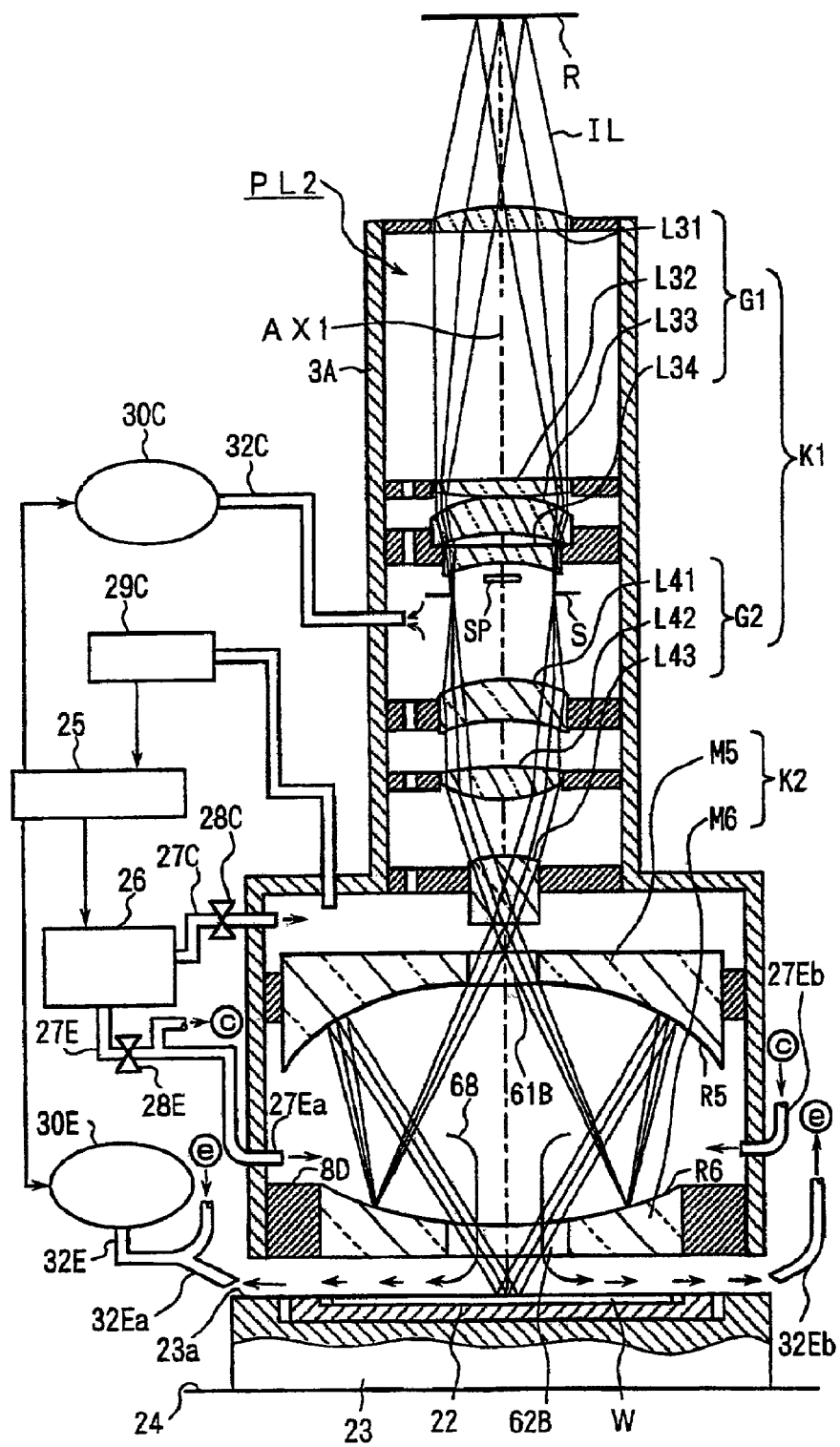
FIG. 5 shows, with partial cross section, a modified embodiment of the second embodiment.

A modified embodiment of the second embodiment will be explained with reference to FIG. 5. With reference to FIG. 5 in which components or parts corresponding to those shown in FIG. 4 are designated by the same reference numerals, a projection optical system PL2 of this modified embodiment is different from the projection optical system PL1 shown in FIG. 4 in that a second image-forming optical system K2 comprises a primary mirror M5 having an aperture 61B and a secondary mirror M6 having an aperture 62B. In this arrangement, the image-forming light flux from the intermediate image comes into the wafer W via the aperture 61B of the primary mirror M5, the reflection surface R6 of the secondary mirror M6, the reflection surface R5 of the primary mirror M5, and the aperture 62B of the secondary mirror M6.

In this modified embodiment, two gas supply tubes 27Ea, 27Eb are arranged at side surface portions of the lens barrel 3A between the primary mirror M5 and the secondary mirror M6 so that the two gas supply tubes 27Ea, 27Eb are opposed to one another with the optical axis AX1 intervening therebetween. The gas supply tubes 27Ea, 27Eb are connected to the gas supply unit 26 via the piping 27E. The other arrangement is the same as that of the embodiment shown in FIG. 4.

In this modified embodiment, in order to supply the purge gas to the region in the vicinity of the exposure area of the wafer W, the operation is performed, in which the high purity purge gas is continuously supplied toward the center between the secondary mirror M6 and the primary mirror M5 of the projection optical system PL1 from the gas supply unit 26 via the gas supply tubes 27E6i a, 27Eb during the exposure, concurrently with which the vacuum pump 30E is used to continuously aspirate the gas via the piping 32E and the gas discharge tubes 32Ea and 32Eb. That is, even when the aperture 62B is also formed for the optical member (secondary mirror M4) disposed at the tip of the projection optical system PL2 as in this modified embodiment, it is unnecessary to daringly install the purge guide plate. The space between the primary mirror M5 and the secondary mirror M6 is filled with the high purity purge gas, and the gas is further pressurized. Accordingly, the high purity purge gas causes the downflow toward the wafer W as indicated by arrows 68. The light-absorbing substance is allowed to flow toward the outer circumferential portions together with the purge gas in the same manner as in the embodiment shown in FIG. 4.

Figure 6:
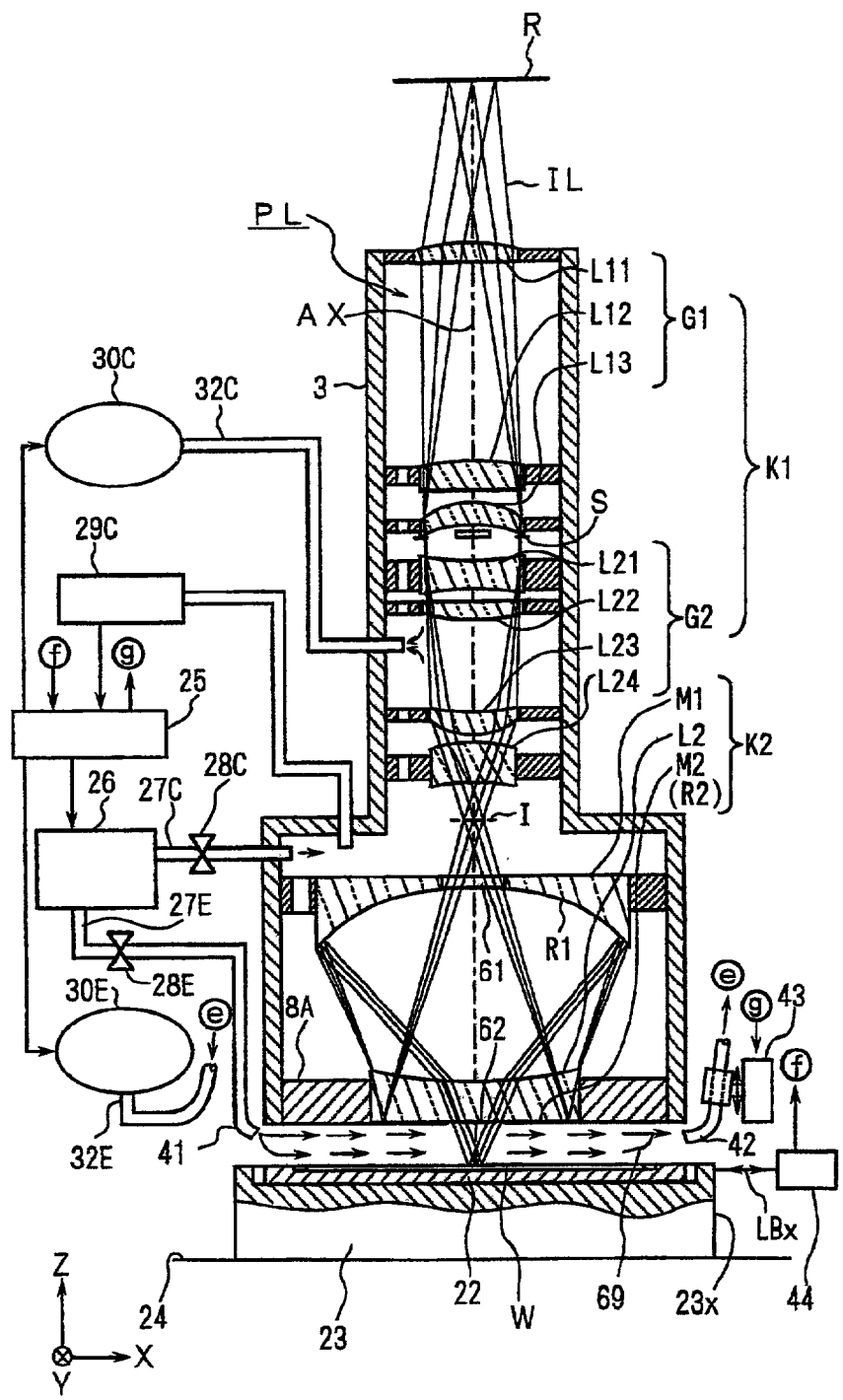
FIG. 6 shows, with partial cross section, an arrangement of those ranging from a projection optical system PL to a wafer stage 23 according to a third embodiment of the present invention.
Figure 7:
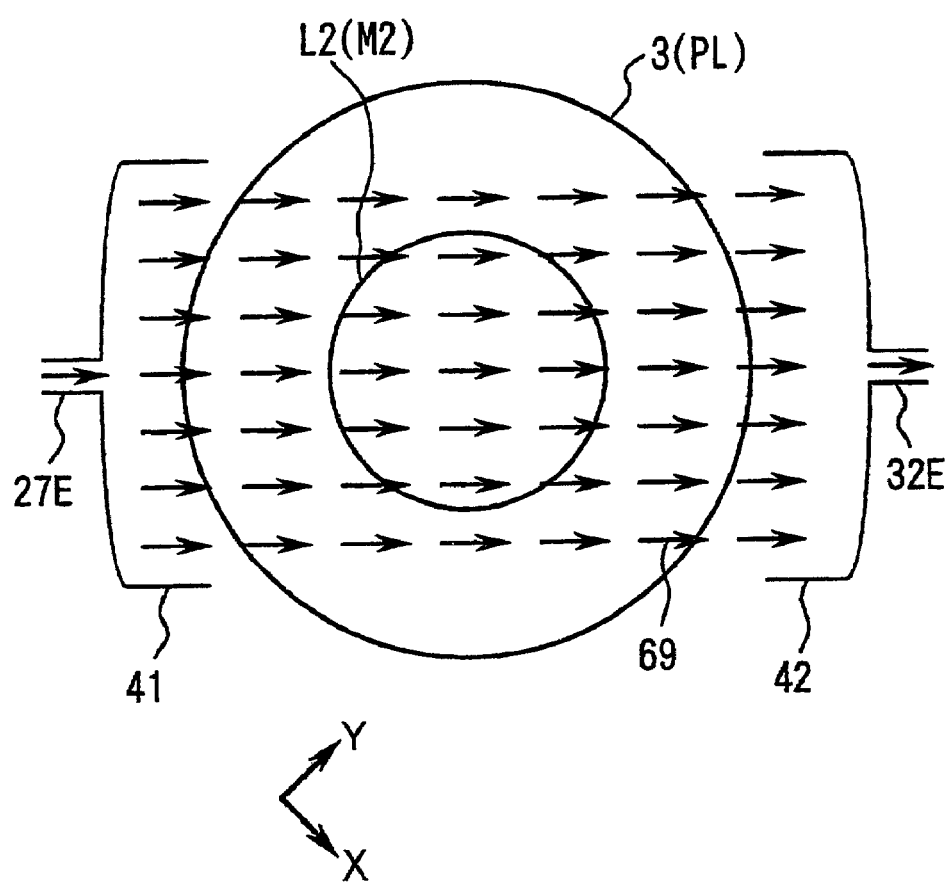
FIG. 7 shows a plan view illustrating the projection optical system PL shown in FIG. 6.
Figure 8:
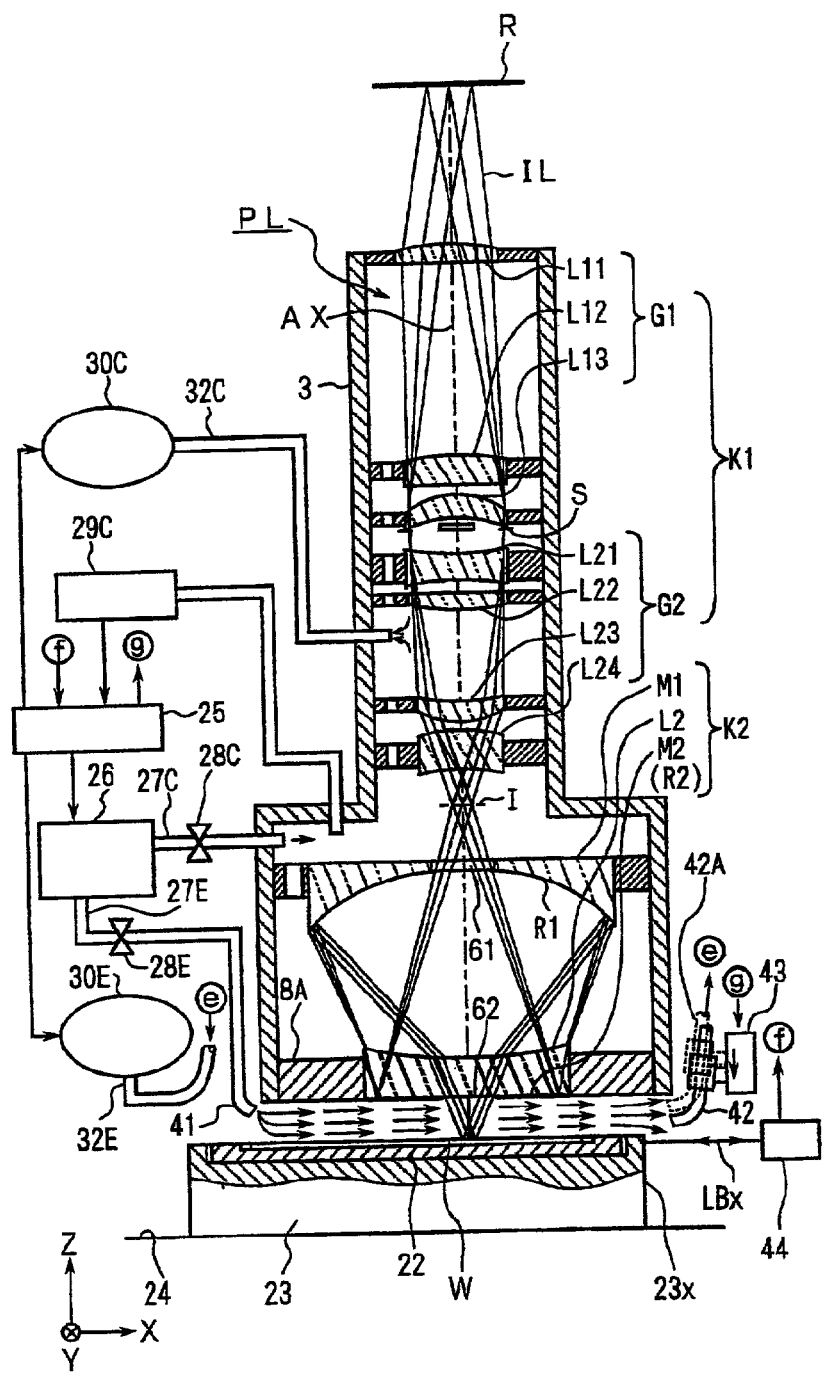
FIG. 8 shows a situation in which the position of the wafer stage is changed in the third embodiment.

Next, a third embodiment of the present invention will be explained with reference to FIGS. 6 to 8. In FIGS. 6 to 8, components or parts corresponding to those shown in FIGS. 1 and 2 are designated by the same reference numerals, detailed explanation of which will be omitted.

FIG. 6 shows a sectional view illustrating an arrangement of those ranging from a projection optical system PL to a wafer stage 23 of a projection exposure apparatus of this embodiment. With reference to FIG. 6, a measuring laser beam LBx is radiated from a laser interferometer 44 onto a reflection surface (alternatively a movement mirror) of a side surface in the +X direction of a wafer stage 23. The laser beam LBx is actually composed of laser beams based on a plurality of axes, for example, of three or more axes. The laser interferometer 44 measures the X coordinate, the angle of rotation about the Y axis (rolling amount), and the angle of rotation about the Z axis (yawing amount) of the wafer stage 23 by receiving an interference light beam of the laser beam LBx and an unillustrated reference beam. Measured values are supplied to a main control system 25. Similarly, a laser interferometer (not shown) is also arranged to radiate a laser beam onto the reflection surface of a side surface in the Y direction of the wafer stage 23. The Y coordinate and the angle of rotation about the X axis (pitching amount) of the wafer stage 23 are measured by the laser interferometer. The main control system 25 controls the position, the movement velocity, and the angle of rotation of the wafer stage 23 on the basis of the measured values by the aid of an unillustrated wafer stage-driving system.

In this embodiment, the purge guide plate 33 shown in FIG. 2 is not installed in the working distance region between the wafer W and the secondary mirror M2 which is the tip of the projection optical system PL. For this arrangement, a gas supply tube 41, which is connected to a gas supply unit 26 via a piping 27E, is installed on a side surface in the −X direction of the working distance region. A gas discharge tube 42, which is connected to a vacuum pump 30E via a piping 32E, is installed on a side surface in the +X direction of the working distance region. The gas supply tube 41 and the gas discharge tube 42 are arranged symmetrically in relation to the center (which coincides with the optical axis AX in this embodiment) of the exposure area on the wafer W. Further, the tip of the piping 32E connected to the gas discharge tube 42 has a flexible structure. A slide unit 43 for shifting the gas discharge tube 42 in the vertical direction (Z direction) is arranged in the vicinity of the lower side surface of the projection optical system PL.

FIG. 7 shows a plan view of the projection optical system PL shown in FIG. 6. With reference to FIG. 7, the tip (gas supply port) of the gas supply tube 41 is widened to be approximately not less than the width of the secondary mirror M2, i.e., not less than the width of the exposure area on the wafer. The tip (gas discharge port) of the gas discharge tube 41 is widened to be approximately the same as the width of the gas supply port, or slightly wider than the width of the gas supply port. Accordingly, almost all of the purge gas supplied from the gas supply tube 41 flows into the gas discharge tube 42 as indicated by arrows 69. The gas supply tube 41 and the gas discharge tube 42 are arranged in a direction intersecting the X axis (Y axis) by about 45°, i.e., in the diagonal direction of the upper surface of the wafer stage 23 shown in FIG. 6. Accordingly, the following advantage is obtained. That is, even when the purge gas is supplied, the optical path, for example, for the laser beam LBx of the laser interferometer 44 is less fluctuated. Further, for example, the positioning accuracy of the wafer stage 23 is improved.

With reference to FIG. 6 again, the valve 28E is in the open state in a state in which the entire upper surface of the wafer stage 23 is substantially located between the tip of the gas supply tube 41 and the tip of the gas discharge tube 42 so that the high purity purge gas is supplied to the working distance region at a predetermined flow rate per unit time from the gas supply unit 26 via the piping 27E and the gas supply tube 41 in this embodiment. The tip of the gas discharge tube 42 is substantially arranged on the side surface of the working distance region. Accordingly, the high purity purge gas, which outflows from the gas supply tube 41, passes over the exposure section on the wafer W. The purge gas travels in company with the release gas released from the wafer W, and the purge gas is introduced into the gas discharge port 15 which is installed at the end in the diagonal direction of the wafer stage 13. As described above, this embodiment differs in that the flow of the purge gas in a form of laminar flow is realized in the direction perpendicular to the optical axis AX of the projection optical system PL, unlike the downflow of the high purity purge gas about the center (optical axis) of the exposure area as in the first and second embodiments described above. In this arrangement, it is needless to say that the formation of the laminar flow of the purge gas is important, for the following reason. That is, if a flow of turbulence arises, then it is impossible to ensure the uniformity of the density of the purge gas, and any distribution of refractive index can occur. As a result, it is feared that any uneven exposure may occur for the exposure pattern.

The flow of the purge gas is depicted over the wide area over the wafer in FIG. 7 in this embodiment. However, it is clear that the effect of the present invention is also obtained by only causing a flow of the purge gas along only the diagonal direction including the portion disposed in the vicinity of the center of the exposure area. Also in this embodiment, the high purity purge gas can be supplied to the region over the exposure area on the wafer W, even when the spacing distance of the working distance region is short, in the same manner as in the second embodiment.

Next, explanation will be made for the operation to be performed when the end (reflection surface 23X) of the wafer stage 23 arrives at a position approximately located between the tip of the gas supply tube 41 and the tip of the gas discharge tube 42 as shown in FIG. 8 in this embodiment. In this embodiment, it is assumed that the flow of the purge gas over the wafer stage 23 is the uniform flow in the form of laminar flow. However, it is thought that when the terminal end of the flow of the purge gas arrives at the end of the wafer stage 23, the gas flow may be disturbed to be in a form of turbulence. In such a situation, the disturbed gas flow is mixed with the external atmosphere in a complex manner, and any variation occurs in the refractive index thereby. Therefore, any bad influence is exerted on the measured values of the autofocus sensor and the laser interferometer 44 for positioning the wafer stage 23. Accordingly, in this embodiment, the distance between the end of the wafer stage 23 and the exposure area is calculated from the measured value of the laser interferometer 44. When the exposure area approaches the end of the wafer stage 23 as shown in FIG. 8, the flow rate or the flow passage of the purge gas is adjusted. Accordingly, the influence of the refractive index, which is caused by the mixing of the purge gas and the external atmosphere at the end of the wafer stage 23, is mitigated.

Specifically, when the exposure area approaches the end of the wafer stage 23 (optical path for the laser beam of the laser interferometer 44), the flow rate of the purge gas may be increased. Accordingly, even when the purge gas outflows from the end of the wafer stage 23 to the outside of the wafer stage 23, then the disturbance is less exerted, and the amount of mixing of the purge gas and the external atmosphere is further decreased. Therefore, it is possible to suppress, to the minimum, the measurement error in the autofocus sensor system and the positioning system for the wafer stage 23 at the terminal end of the purge gas flow.

In this embodiment, it is needless to say that the measurement error is further decreased by continuously changing the flow rate of the purge gas depending on the distance between the end of the wafer stage 23 and the exposure area.

Concurrently with the operation for changing the flow rate as described above or separately from the operation, the position of the gas discharge tube 42 may be deviated downwardly with respect to the ordinary position 42A by the aid of the slide unit 43 as shown in FIG. 8. When the flow passage is changed as described above, then the purge gas, which is diffused widely as compared with the ordinary situation, inflows into the gas discharge tube 42 highly efficiently, and the optical path for the laser beam LBx is less fluctuated.

It is needless to say that the method for controlling the state (for example, the flow rate and the flow passage) of the purge gas as described above is also effective in the first embodiment and the second embodiment.

In the respective embodiments described above, it is assumed that helium (He) is used as the purge gas. However, in the case of any inert gas including, for example, nitrogen ($N_2$) and rare gas (for example, argon (Ar)), the amount of absorption for the vacuum ultraviolet light beam is small, and especially the amount of absorption for the $F_2$ laser beam is small in a degree of being almost negligible. Therefore, it is clear that good results are equivalently obtained even when any inert gas is used in the embodiments described above. Further, when the atmosphere of the space for surrounding the outer circumference of the wafer is filled with a gas of the same type as that of the high purity purge gas to realize an impurity concentration which is approximate to that of the high purity purge gas as closely as possible, it is possible to further decrease the amount of change of the refractive index in the working distance region, even when the external air is mixed to some extent. Therefore, it is possible to reduce, to the minimum, the bad influence exerted on the autofocus sensor and the interferometer for positioning the wafer (wafer stage).

Further, the release gas, which contains the light-absorbing substance released from the photoresist applied onto the wafer W, differs in amount and type depending on, for example, the temperature and the type of the photoresist. In such a situation, the amount and the type of the release gas from the photoresist may be previously investigated, and the flow rate of the high purity purge gas may be adjusted depending on the photoresist. Specifically, when the amount of the release gas is small, and/or when the release gas is of a relatively heavy type in which molecules having short mean free paths occupy a dominant part, then the optical member disposed at the tip of the projection optical system can be prevented from adhesion of the release gas from the photoresist by decreasing the flow rate of the purge gas to be in a small amount. Accordingly, the light-absorbing substance can be excluded more reliably. On the other hand, it is possible to suppress, to the necessary minimum, the amount of consumption of the high purity purge gas which is generally expensive. It is possible to realize the decrease in cost as well.

In the embodiment described above, the upper surface 23a of the wafer stage 23 is substantially the same plane as the surface of the wafer W. Therefore, the flow of the purge gas is in the state of being approximate to the uniform laminar flow. It is possible to efficiently exclude the release gas from the wafer W. However, it is needless to say that the present invention is also effective when any difference in height exists between the upper surface of the wafer stage 23 and the surface of the wafer W.

In the embodiment described above, the gas containing the light-absorbing substance is efficiently discharged from the optical path space (especially from the working distance region) containing the light-absorbing substance. However, it is needless to say that the effect of the present invention is obtained more remarkably when the generation of the impurity itself is reduced. In other words, the foregoing explanation has been made while principally referring to the exclusion of the release gas from the photoresist applied onto the wafer W. However, the release gas, which is generated from those other than the photoresist, exerts bad influences such as the decrease in illuminance and the uneven illuminance. Therefore, such a release gas may be fundamentally reduced. Especially, attention should be paid for water molecules, hydrocarbon, and halide among the light-absorbing substances which are in issue herein. It is known that water molecules adhere in a large amount to the surface of the structural material. Such water molecules are gradually released from the surface of the structural material, and they gradually leak to the optical path including the working distance region (hereinafter referred to as "optical path space") in accordance with the interaction with the purge gas, for example, during the discharge in vacuum. It is also known that the amount of adsorption of the light-absorbing substance greatly differs depending on the surface state of the structural material.

For example, the larger the surface area of the structural material is, the larger the number of molecules of the adhered light-absorbing substance is. Therefore, it is desirable that the optical path space is designed so that no fine structure is provided in order to decrease the surface area. For the same reason, it is preferable that the surface roughness of the structural material is reduced by performing the polishing by means of a method including the mechanical polishing, the electrolytic polishing, the buffing, the chemical polishing, and GBB (Glass Bead Blasting). After applying the treatment as described above, an artifice may be applied to reduce the amount of the release gas from the surface of the structural material by previously washing the surface of the structural material before the exposure of the circuit pattern in accordance with a technique including, for example, the ultrasonic washing, the spray of fluid such as clean dry air, and the vacuum heating degassing (baking).

It is also known that the light-absorbing substance such as hydrocarbon and halide is released, for example, from the adhesive, the seal member (for example, the O-ring), and the electric wire-coating substance existing in the optical path space. In the embodiment described above, when the amount of generation of the light-absorbing substance is fundamentally suppressed beforehand by effecting the countermeasure including, for example, the exclusion of the installation of, for example, the adhesive, the seal member (for example, the O-ring), and the electric wire-coating substance containing hydrocarbon and halide in the optical path space as far as possible, and the utilization of materials which generate less release gas, the effect of the present invention is obtained more remarkably in the same manner as in the treatment against water molecules described above.

In the embodiment described above, the arrangement has been explained, in which the optical elements for constructing the illumination optical system are accommodated in the illumination system chamber 1, and the interior of the illumination system chamber 1 is purged with the inert gas. However, each of the spaces for the optical elements for constructing the illumination optical system may be provided with a supply tube and a discharge tube for the inert gas to effect the purging operation. Such an arrangement may be also adopted for the projection optical system in the same manner as described above.

Further, the concentration of the light-absorbing substance may be managed with different values, for example, for the illumination system chamber 1 shown in FIG. 1, the reticle chamber 2, the projection optical system PL, and the space (wafer space) between the projection optical system PL and the wafer W. In this arrangement, the concentration of the light-absorbing substance may be managed in the reticle chamber 2 and the wafer space with values which are lower than those of the concentrations of the light-absorbing substance in the illumination system chamber 1 and the projection optical system PL, because the movable mechanism such as the stage is provided in the reticle chamber 2 and the wafer space.

Alternatively, the concentration of the light-absorbing substance may be managed for each of the spaces for the optical elements for constructing the illumination optical system and the projection optical system PL.

It is desirable that each of the casing (alternatively a cylindrical member) for constructing the cover 4 for those ranging from the illumination system chamber 1 to the wafer-operating unit 7 shown in FIG. 1 and the pipings for supplying the helium gas or the like is formed of a material which generates the minimum amount of impurity gas (release gas) including, for example, stainless steel and various polymers such as those of tetrafluoroethylene, tetrafluoroethylene-terfluoro(alkyl vinyl ether), or tetrafluoroethylene-hexafluoropropene copolymer.

Further, it is desirable that the cable or the like for supplying the electric power, for example, to the driving mechanism (for example, the reticle blind and the stage) in each of the casings is coated with a material which generates the minimum amount of the impurity gas (release gas) in the same manner as described above.

It is clear that the present invention is not limited to the projection exposure apparatus of the scanning exposure type, which is also applicable, for example, to a projection exposure apparatus of the full field exposure type (stepper type). The projection optical system provided for such a projection exposure apparatus is not limited to the catadioptric system as used in the embodiment described above, which may be a refracting system or a reflecting system. The magnification of the projection optical system is not limited to the reduction magnification, which may be 1× magnification or expansion.

The present invention is especially effective when the ArF excimer laser light beam (wavelength: 193 nm) is used for the exposure light beam, and when the vacuum ultraviolet light beam having a wavelength of about 200 nm to 100 nm, i.e., the light beam in a wavelength region having large absorption with respect to oxygen including, for example, the $Kr_2$ laser beam (wavelength: 146 nm), the $Ar_2$ laser beam (wavelength: 126 nm), the high harmonic wave such as the YAG laser, and the high harmonic wave of the semiconductor laser is used for the exposure light beam.

In place of the excimer laser, the $F_2$ laser and the like, it is also allowable to use a high harmonic wave which is obtained such that a single wavelength laser in the infrared region or the visible region, which is oscillated from a DFB (Distribution Feedback) semiconductor laser or a fiber laser, is amplified with a fiber amplifier doped with, for example, erbium (Er) (or both of erbium and ytterbium (Yb)), followed by wavelength conversion into an ultraviolet light beam by using nonlinear optical crystal.

For example, assuming that the oscillation wavelength of the single wavelength laser is within a range of 1.544 to 1.553 μm, an 8-fold high harmonic wave within a range of 193 to 194 nm, i.e., an ultraviolet light beam having approximately the same wavelength as that of the ArF excimer laser is obtained. On the other hand, assuming that the oscillation wavelength is within a range of 1.57 to 1.58 μm, a 10-fold high harmonic wave within a range of 157 to 158 nm, i.e., an ultraviolet light beam having approximately the same wavelength as that of the $F_2$ laser is obtained.

Further, assuming that the oscillation wavelength is within a range of 1.03 to 1.12 μm, a 7-fold high harmonic wave having a generated wavelength within a range of 147 to 160 nm is outputted. Especially, assuming that the oscillation wavelength is within a range of 1.09 to 1.106 μm, a 7-fold high harmonic wave having a generated wavelength within a range of 157 to 158 nm, i.e., an ultraviolet light beam having approximately the same wavelength as that of the $F_2$ laser is obtained. In this case, for example, an ytterbium-dope-fiber laser can be used as the single wavelength oscillation laser.

The projection exposure apparatus in the embodiment described above is assembled by adjusting the illumination optical system and the projection optical system, and connecting the respective constitutive elements electrically, mechanically, or optically. More specifically, the projection exposure apparatus shown in FIG. 1 may be constructed such that the respective optical members described above for constructing the projection optical system PL are subjected to positional adjustment to assemble the projection optical system PL, the purge guide plate 33 is attached to the tip portion on the image plane side (wafer side) thereof, and then the mechanism for supplying the purge gas from the side surface to the space between the projection optical system PL and the purge guide plate 33 is installed. Accordingly, the projection exposure apparatus can be efficiently produced. On the other hand, the projection exposure apparatus shown in FIG. 6 may be constructed such that the projection optical system PL and the wafer stage 23 are arranged in the predetermined positional relationship, the mechanism for supplying the purge gas from the side surface direction to the space between the projection optical system PL and the wafer stage 23 is arranged, and then the slide unit 43 and other components for controlling the state of the flow of the purge gas depending on the position of the wafer stage 23 are arranged. It is desirable that the operation in this procedure is performed in a clean room in which the temperature is managed.

The wafer W, for which the exposure has been performed as described above, is subjected to, for example, the development step, the pattern formation step, the bonding step, and the packaging. Accordingly, a device such as a semiconductor element is produced. Further, the present invention is also applicable to the production of devices including, for example, display elements such as liquid crystal display elements and plasma displays, and thin film magnetic disks. The present invention is also applicable when a photomask for the projection exposure apparatus is produced.

It is a matter of course that the present invention is not limited to the embodiments described above, which may be embodied in other various forms without deviating from the gist or essential characteristics of the present invention.

INDUSTRIAL APPLICABILITY

According to the first exposure method of the present invention, the guide member, which has the aperture at the field center, is provided in the space (working distance region) between the substrate and the tip of the projection optical system on the side of the substrate as the exposure objective (second object). Alternatively, the downflow is caused for the gas through which the exposure light beam is transmitted, toward the substrate from the aperture formed at the center of the optical member disposed at the tip. Accordingly, an advantage is obtained such that the gas, through which the exposure light beam is transmitted, can be supplied with ease to the space between the projection optical system and the substrate as the exposure objective. Therefore, it is possible to maintain a high intensity of the exposure light beam on the substrate as the exposure objective.

The flow of the gas makes it possible to reduce the decrease in illuminance due to the light absorption by the release gas and the phenomenon in which the release gas from the substrate adheres to the optical member disposed at the tip of the projection optical system to cause the decrease in illuminance of the exposure light beam. Further, the release gas from the substrate is efficiently discharged. Thus, it is possible to further enhance the uniformity of the exposure light beam, the amount of light sufficient for the exposure can be allowed to arrive at the exposure surface, it is possible to enhance the line width uniformity of the exposed circuit pattern, and it is possible to further enhance the production speed (throughput) for electronic devices.

According to the second exposure method of the present invention, the gas, through which the exposure light beam is transmitted, is allowed to flow in the form of laminar flow over the substrate as the exposure objective (second object) in an arbitrary direction of the optical member disposed at the tip of the projection optical system. Further, the state of the flow is controlled depending on the position of the stage. Thus, it is possible to avoid the decrease in positioning accuracy of the stage.

According to the exposure apparatus of the present invention, it is possible to carry out the exposure method of the present invention. According to the method for producing the device of the present invention, it is possible to produce the device having high function at a high throughput.

What is claimed is:

1. An exposure method for exposing a second object via a projection optical system with an exposure light beam having passed through a pattern on a first object, the exposure method comprising:
   supplying a gas through which the exposure light beam is transmitted, to a space between the projection optical system and the second object; and
   controlling a state of flow of the gas depending on a position of a stage which positions the second object.

2. The exposure method according to claim 1, wherein a flow rate of the gas is increased when an exposure area on the second object is set at an end of the stage.

3. The exposure method according to claim 1, wherein the gas, which is supplied to the space between the projection optical system and the second object, is discharged.

4. The exposure method according to claim 3, wherein the supply of the gas and the discharge of the gas are performed at symmetrical positions in relation to an optical axis of the projection optical system.

5. The exposure method according to claim 4, wherein the position of the discharge of the gas is changed depending on the position of the stage.

6. An exposure apparatus for exposing a second object via a projection optical system with an exposure light beam having passed through a pattern on a first object, the exposure apparatus comprising:
- a guide member which is separate from the projection optical system and is arranged between the second object and the projection optical system and which is provided with an aperture for allowing the exposure light beam having passed through the projection optical system to pass therethrough; and
- a gas supply unit which supplies a gas through which the exposure light beam is transmitted, through the aperture of the guide member toward the second object.

7. The exposure apparatus according to claim 6, further comprising a gas-aspirating unit which aspirates the gas flowing through a space between the guide member and a surface of the second object toward an outer circumferential side of the second object.

8. The exposure apparatus according to claim 7, further comprising a stage which positions the second object, wherein a height of an upper surface of the stage is substantially the same as a height of a surface of the second object.

9. The exposure apparatus according to claim 6, wherein the exposure light beam is a light beam in a wavelength region in which the light beam is greatly absorbed by oxygen, and the gas is chemically inert, from which any impurity is removed.

10. An exposure apparatus for exposing a second object via a projection optical system with an exposure light beam having passed through a pattern on a first object, the exposure apparatus comprising:
- a stage which positions the second object;
- a gas supply unit which supplies a gas through which the exposure light beam is transmitted, to a space between the projection optical system and the second object; and
- a control unit which controls a state of flow of the gas supplied by the gas supply unit, depending on a position of the stage.

11. The exposure apparatus according to claim 10, wherein a height of an upper surface of the stage which positions the second object is substantially the same as a height of a surface of the second object.

12. The exposure apparatus according to claim 10, further comprising a gas discharge tube which discharges the gas supplied to the space between the projection optical system and the second object.

13. The exposure apparatus according to claim 12, wherein the gas discharge tube and a gas supply tube provided for the gas supply unit are arranged symmetrically in relation to an optical axis of the projection optical system.

14. The exposure apparatus according to claim 13, further comprising:
- an interferometer which measures the position in an X axis direction or the position in a Y axis direction of the stage, wherein:
- the gas supply tube and the gas discharge tube are arranged in a direction intersecting the X axis direction or the Y axis direction by substantially 45°.

15. The exposure apparatus according to claim 12, wherein the control unit controls the state of the flow of the gas by changing a position of the gas discharge tube.

16. The exposure apparatus according to claim 12, further comprising a slide unit which shifts a position of the gas discharge tube, wherein the control unit shifts the position of the gas discharge tube by controlling the slide unit.

17. A method for producing an exposure apparatus for exposing a second object via a projection optical system with an exposure light beam having passed through a pattern on a first object, the production method comprising:
- providing the projection optical system;
- providing a guide member that is separate from the projection optical system, the guide member having an aperture for allowing the exposure light beam having passed through the projection optical system to pass therethrough, the guide member provided at an end of the projection optical system on a side of the second object; and
- providing a gas supply unit which supplies a gas through which the exposure light beam is transmitted, the gas supply unit supplying the gas toward the second object through the aperture of the guide member.

18. A method for producing an exposure apparatus for exposing a second object via a projection optical system with an exposure light beam having passed through a pattern on a first object, the production method comprising:
- providing the projection optical system and a stage which positions the second object;
- providing a gas supply unit which supplies a gas through which the exposure light beam is transmitted, the gas supply unit supplying the gas between the projection optical system and the second object; and
- providing a control unit which controls a state of flow of the gas supplied by the gas supply unit, depending on a position of the stage.

19. An exposure method for exposing a second object via a projection optical system with an exposure light beam having passed through a pattern on a first object, the exposure method comprising:
- supplying a gas through which the exposure light beam is transmitted, toward an optical path for the exposure light beam on a side of a tip of the projection optical system in a space between the second object and the tip of the projection optical system; and
- aspirating, from the optical path for the exposure light beam, the gas which has flown from the tip of the projection optical system toward the second object.

20. The exposure method according to claim 19, wherein:
- a guide member, which is provided with an aperture for allowing the exposure light beam to pass therethrough, is provided between the second object and the tip of the projection optical system; and
- the gas, through which the exposure light beam is transmitted, flows through the aperture toward the second object.

21. The exposure method according to claim 20, wherein the gas is continuously supplied to the optical path for the exposure light beam, and the gas is continuously aspirated from the optical path for the exposure light beam.

22. An exposure apparatus for exposing a second object via a projection optical system with an exposure light beam having passed through a pattern on a first object, the exposure apparatus comprising:
- a gas supply unit which is arranged on a side of a tip of the projection optical system between the second object and the tip of the projection optical system and which supplies a gas through which the exposure light beam is transmitted, toward an optical path for the exposure light beam; and a gas-aspirating unit which aspirates, from the optical path for the exposure light beam, the gas which has flown from the tip of the projection optical system toward the second object.

23. The exposure apparatus according to claim 22, further comprising:
a guide member which is arranged between the second object and the tip of the projection optical system and which is provided with an aperture for allowing the exposure light beam to pass therethrough, wherein:
the gas-aspirating unit aspirates the gas which has flown through the aperture toward the second object.

24. The exposure apparatus according to claim 23, wherein the gas supply unit and the gas-aspirating unit are arranged symmetrically in relation to an optical axis of the projection optical system.

25. An exposure method for exposing a second object via a projection optical system with an exposure light beam having passed through a pattern on a first object, the exposure method comprising:
supplying a gas through which the exposure light beam is transmitted, from a circumference of a tip of the projection optical system toward an optical path for the exposure light beam in a space between the second object and the tip of the projection optical system; and
aspirating a part of the gas which has flown toward the second object from the circumference of the tip of the projection optical system.

26. The exposure method according to claim 25, further comprising providing, between the second object and the tip of the projection optical system, a gas supply member having an aperture through which the exposure light beam passes,
wherein the gas flows toward the second object through the aperture.

27. The exposure method according to claim 26, wherein the aspiration of the part of the gas is performed via a space between the gas supply member and a surface of the second object.

28. An exposure apparatus for exposing a second object via a projection optical system with an exposure light beam having passed through a pattern on a first object, the exposure apparatus comprising:
a gas supply unit which is arranged between the second object and a tip of the projection optical system and which provides, toward a path for the exposure light beam, a gas through which the exposure light beam is transmitted; and
a gas-aspirating unit which aspirates a part of the gas which has flown toward the second object from the gas supply unit.

29. The exposure apparatus according to claim 28, wherein:
the gas supply unit has a gas supply member which is provided with an aperture through which the exposure light beam passes; and
the gas-aspirating unit aspirates the part of the gas flown toward the second object through the aperture.

30. The exposure apparatus according to claim 29, wherein the gas-aspirating unit aspirates the part of the gas flown in a space between the gas supply member and a surface of the second object.

* * * * *